(12) United States Patent
Lo et al.

(10) Patent No.: US 11,929,424 B2
(45) Date of Patent: Mar. 12, 2024

(54) SEMICONDUCTOR DEVICE AND METHOD FOR FORMING THE SAME

(71) Applicant: TAIWAN SEMICONDUCTOR MANUFACTURING CO., LTD., Hsinchu (TW)

(72) Inventors: Yi-Chen Lo, Hsinchu County (TW); Li-Te Lin, Hsinchu (TW); Pinyen Lin, Rochester, NY (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/873,962

(22) Filed: Jul. 26, 2022

(65) Prior Publication Data
US 2022/0359724 A1 Nov. 10, 2022

Related U.S. Application Data

(60) Continuation of application No. 16/937,901, filed on Jul. 24, 2020, now Pat. No. 11,424,341, which is a
(Continued)

(51) Int. Cl.
*H01L 21/033* (2006.01)
*H01L 21/027* (2006.01)
(Continued)

(52) U.S. Cl.
CPC .... *H01L 29/66545* (2013.01); *H01L 21/0274* (2013.01); *H01L 21/0337* (2013.01);
(Continued)

(58) Field of Classification Search
CPC ....... H01L 21/02; H01L 21/28; H01L 21/308; H01L 21/311; H01L 21/8234; H01L 21/8238; H01L 21/3086; H01L 21/31239; H01L 21/823437; H01L 21/823431; H01L 21/3213; H01L 21/027; H01L 21/475; H01L 21/0274; H01L 21/28141; H01L 21/3088; H01L 21/3105; H01L 21/31111; H01L 21/0217; H01L 21/033; H01L 21/3113; H01L 21/31144; H01L 21/823842; H01L 21/823821;
(Continued)

(56) References Cited

U.S. PATENT DOCUMENTS

2007/0172997 A1 7/2007 Yagishita et al.
2010/0068652 A1* 3/2010 Takahata ........... H01L 21/31144
430/311
(Continued)

*Primary Examiner* — Chuong A Luu
(74) *Attorney, Agent, or Firm* — Birch, Stewart, Kolasch & Birch, LLP

(57) ABSTRACT

A method includes forming a semiconductor fin on a substrate; forming a dielectric layer over the semiconductor fin; forming a metal gate electrode in the dielectric layer and extending across the semiconductor fin; forming a source/drain regions on the semiconductor fin and on opposite sides of the metal gate electrode; performing a first non-zero bias plasma etching process to the metal gate electrode; after performing the first non-zero bias plasma etching process, performing a first zero bias plasma etching process to the metal gate electrode.

20 Claims, 40 Drawing Sheets

Related U.S. Application Data division of application No. 16/136,339, filed on Sep. 20, 2018, now Pat. No. 10,741,671.

(60) Provisional application No. 62/591,237, filed on Nov. 28, 2017.

(51) Int. Cl.

| | |
|---|---|
| *H01L 21/3065* | (2006.01) |
| *H01L 21/308* | (2006.01) |
| *H01L 21/311* | (2006.01) |
| *H01L 21/321* | (2006.01) |
| *H01L 21/3213* | (2006.01) |
| *H01L 21/768* | (2006.01) |
| *H01L 29/423* | (2006.01) |
| *H01L 29/66* | (2006.01) |
| *H01L 29/78* | (2006.01) |

(52) U.S. Cl.
CPC ...... *H01L 21/3065* (2013.01); *H01L 21/3086* (2013.01); *H01L 21/31122* (2013.01); *H01L 21/3212* (2013.01); *H01L 21/32136* (2013.01); *H01L 21/76832* (2013.01); *H01L 29/4236* (2013.01); *H01L 29/66553* (2013.01); *H01L 29/7851* (2013.01); *H01L 29/7848* (2013.01)

(58) Field of Classification Search
CPC ......... H01L 21/823814; H01L 21/3065; H01L 21/3081; H01L 21/0337; H01L 21/02118; H01L 21/02186; H01L 21/02282; H01L 21/31055; H01L 21/0276; H01L 29/10; H01L 29/768; H01L 29/66; H01L 29/78; H01L 29/785; H01L 29/417; H01L 29/1033; H01L 29/66795; H01L 29/76816; H01L 29/41791; H01L 21/306
USPC ....................................................... 438/703
See application file for complete search history.

(56) References Cited

U.S. PATENT DOCUMENTS

| | | |
|---|---|---|
| 2014/0246736 A1 | 9/2014 | Chang et al. |
| 2015/0194528 A1 | 7/2015 | Okano |
| 2016/0163868 A1 | 6/2016 | Kobayashi et al. |
| 2016/0343706 A1 | 11/2016 | Chang et al. |
| 2018/0130889 A1 | 5/2018 | Xie et al. |
| 2018/0286867 A1* | 10/2018 | Chang ............... H01L 21/76843 |
| 2019/0148372 A1 | 5/2019 | Miao et al. |
| 2019/0198635 A1 | 8/2019 | Zhang et al. |

* cited by examiner

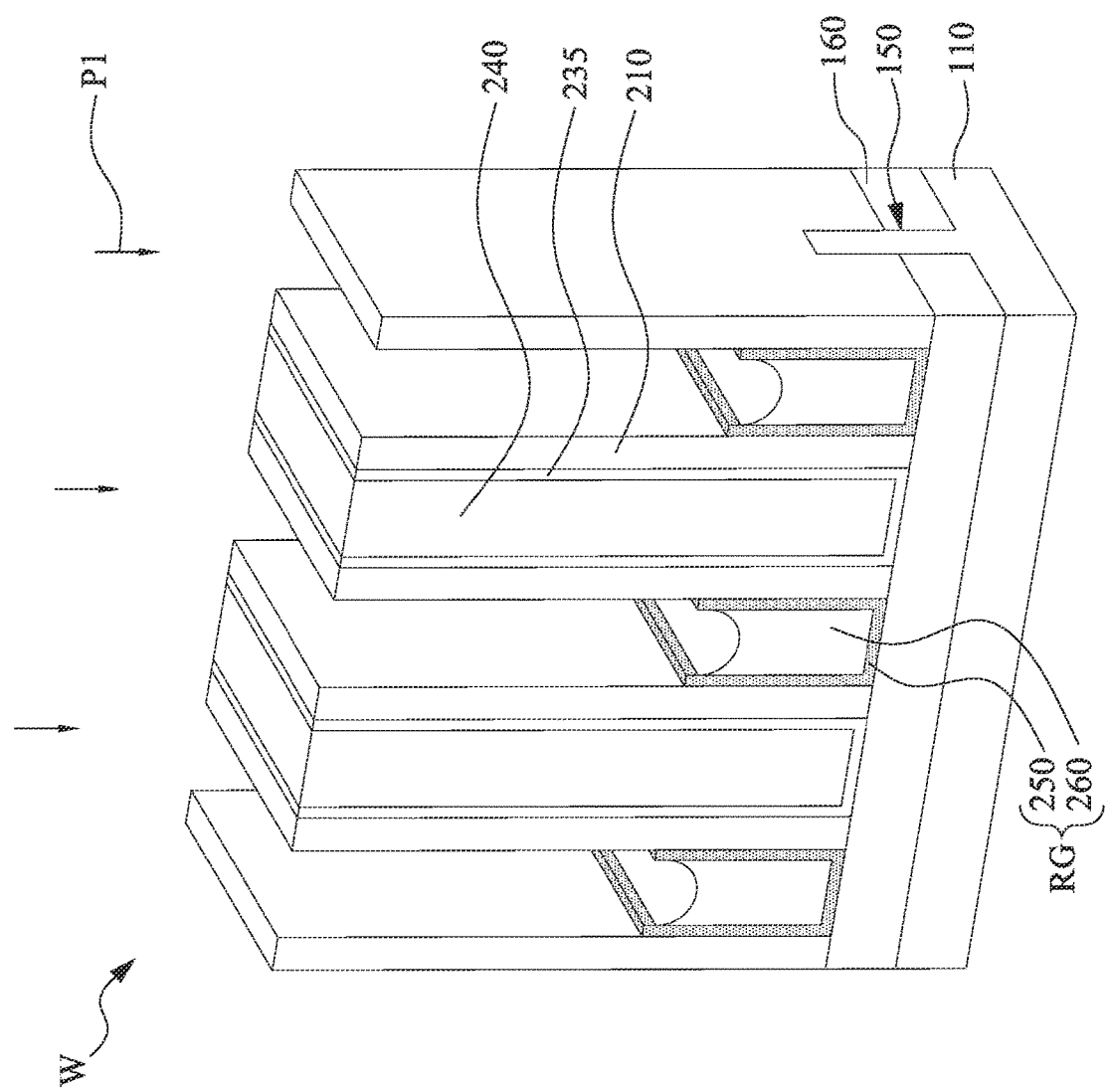

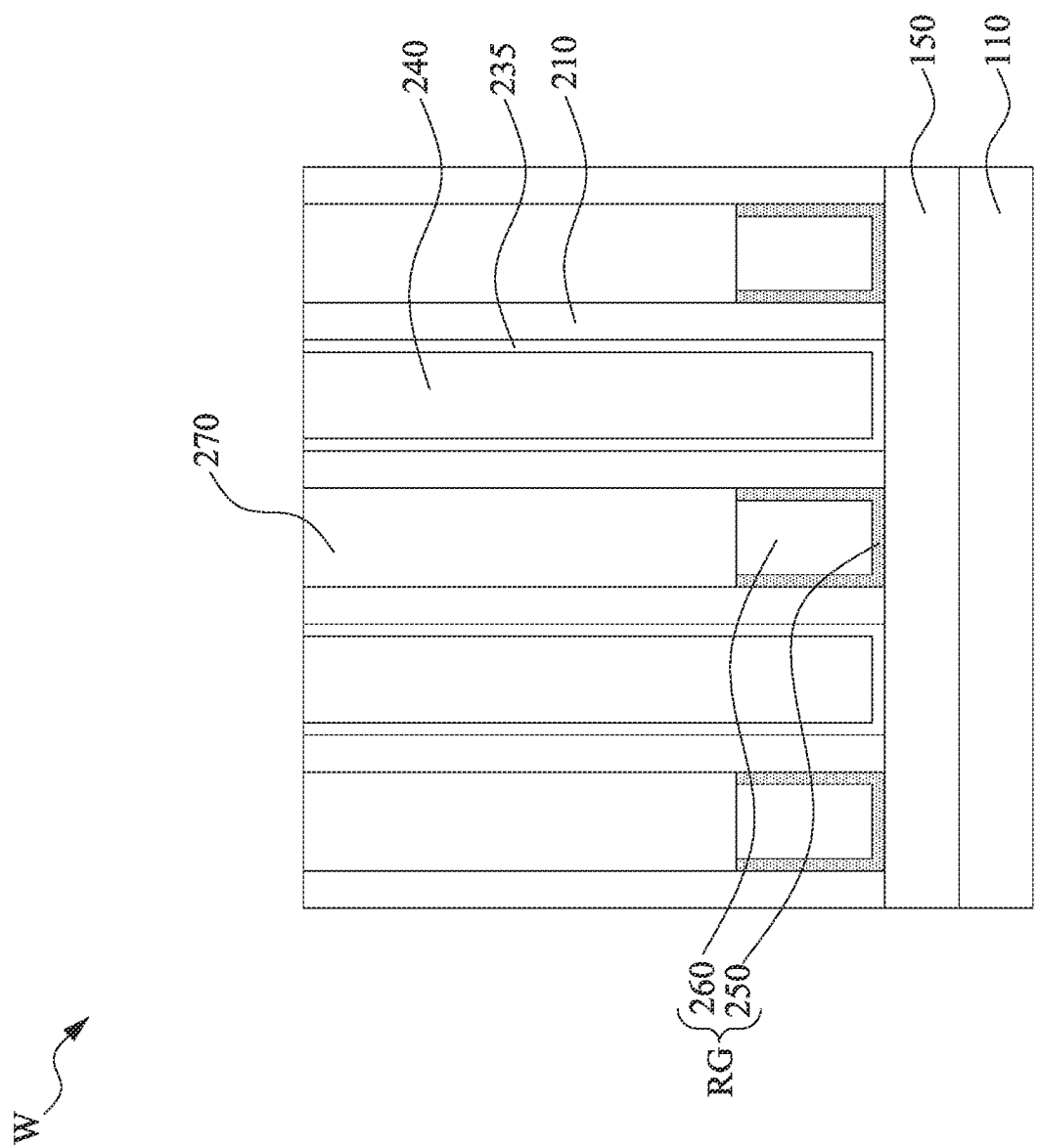

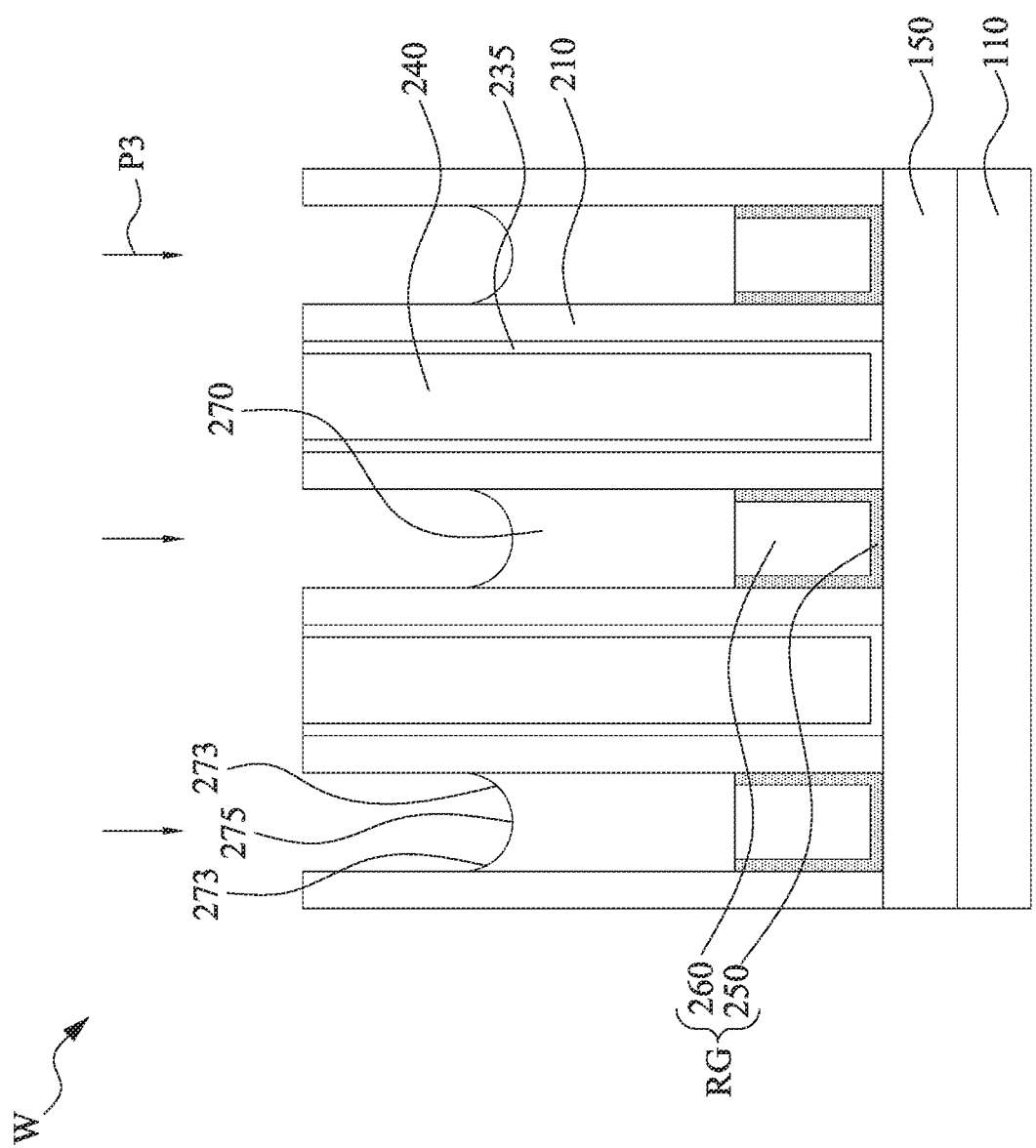

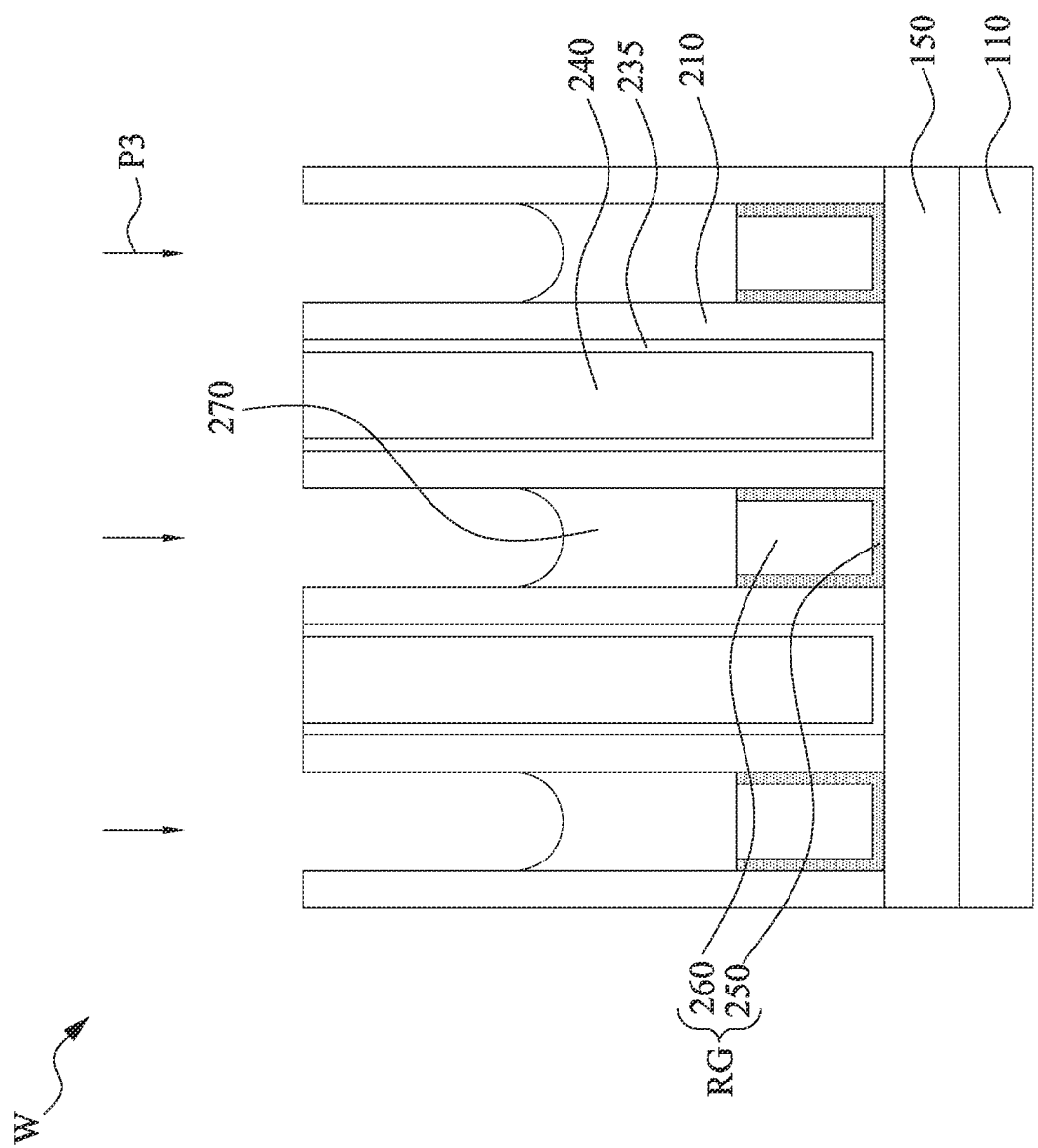

SEMICONDUCTOR DEVICE AND METHOD FOR FORMING THE SAME

PRIORITY CLAIM AND CROSS-REFERENCE

The present application is a Continuation application of U.S. application Ser. No. 16/937,901, filed. Jul. 24, 2020, which is a Divisional application of U.S. application Ser. No. 16/136,339, filed Sep. 20, 2018 (now U.S. Pat. No. 10,741,671, issued Aug. 11, 2020); which claims priority to U.S. Provisional Application Ser. No. 62/591,237, filed Nov. 28, 2017, which are herein incorporated by reference in their entirety.

BACKGROUND

As devices become smaller and integration density increases, reactive ion etching (RIE) has become a key process in anisotropic etching of semiconductor features. RIE or ion-enhanced etching works by a combination of physical and chemical mechanisms for achieving selectivity and anisotropicity during the etching process. Generally, plasma assisted etching operates in the milliTorr range and above. Generally, three processes compete with each other during plasma etching; physical bombardment by ions, chemical etching by radicals and ions; and surface passivation by the deposition of passivating films. In some applications, for example, high density plasmas (HDP) having a higher density of ions and operating at lower pressures has been increasingly used in etching processes.

BRIEF DESCRIPTION OF THE DRAWINGS

Aspects of the present disclosure are best understood from the following detailed description when read with the accompanying figures. It is noted that, in accordance with the standard practice in the industry; various features are not drawn to scale. In fact, the dimensions of the various features may be arbitrarily increased or reduced for clarity of discussion.

FIGS. 15A-26A are perspective views of a local semiconductor device at various stages of fabrication in accordance with some embodiments of the present disclosure.

FIGS. 15B-26B are side views of FIGS. 15A-26A respectively.

DETAILED DESCRIPTION

Figure 1A:
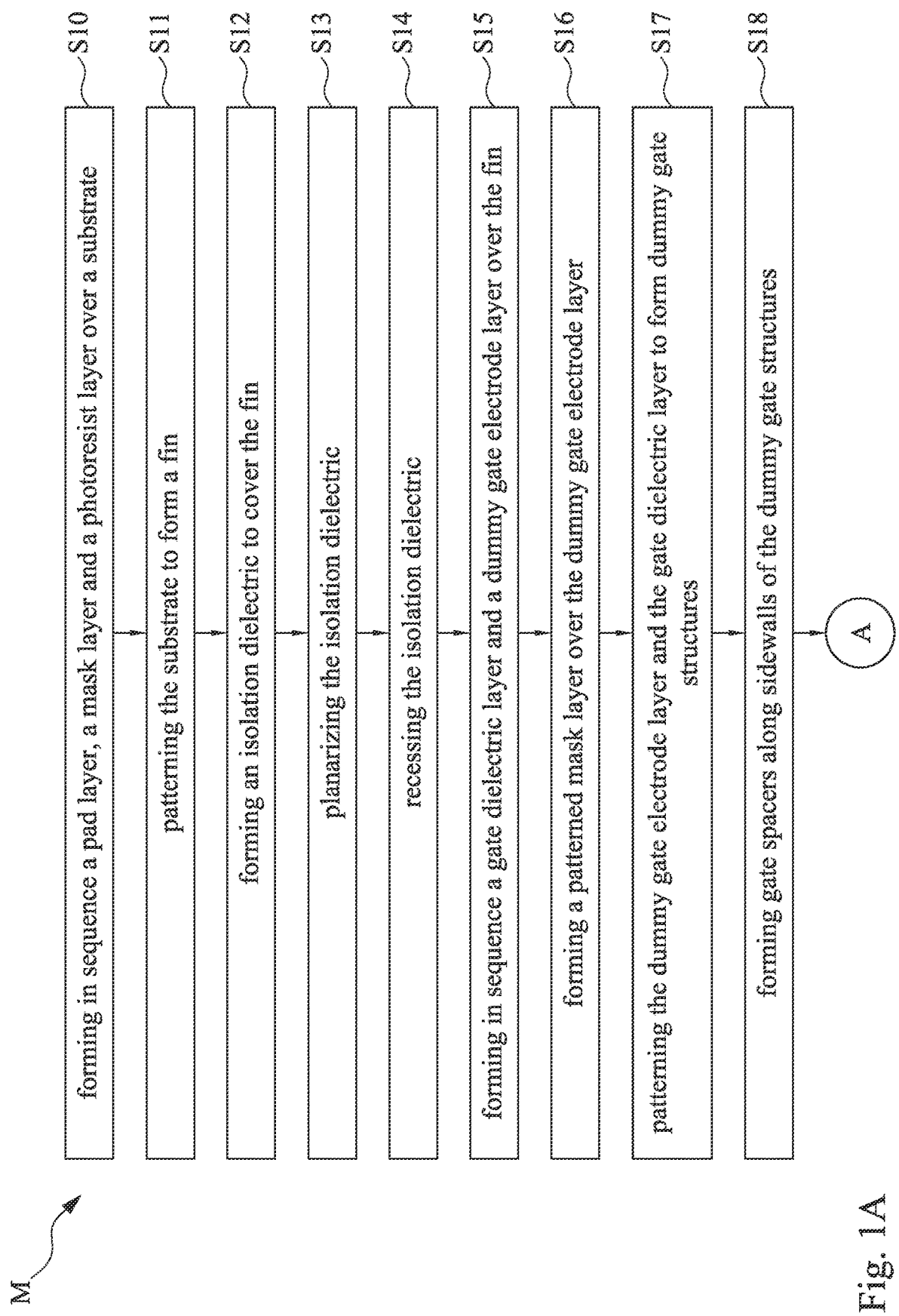
FIGS. 1A to 1B illustrate a block diagram of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide an improved metal gate etch back (MGEB) process and/or an improved self-aligned contact (SAC) SiN layer etch back process, which may be employed in any of a variety of device types. For example, embodiments of the present disclosure may be used to form gate stacks suitable for use in planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or the like. In addition, embodiments disclosed herein may be employed in the formation of P-type and/or N-type devices.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
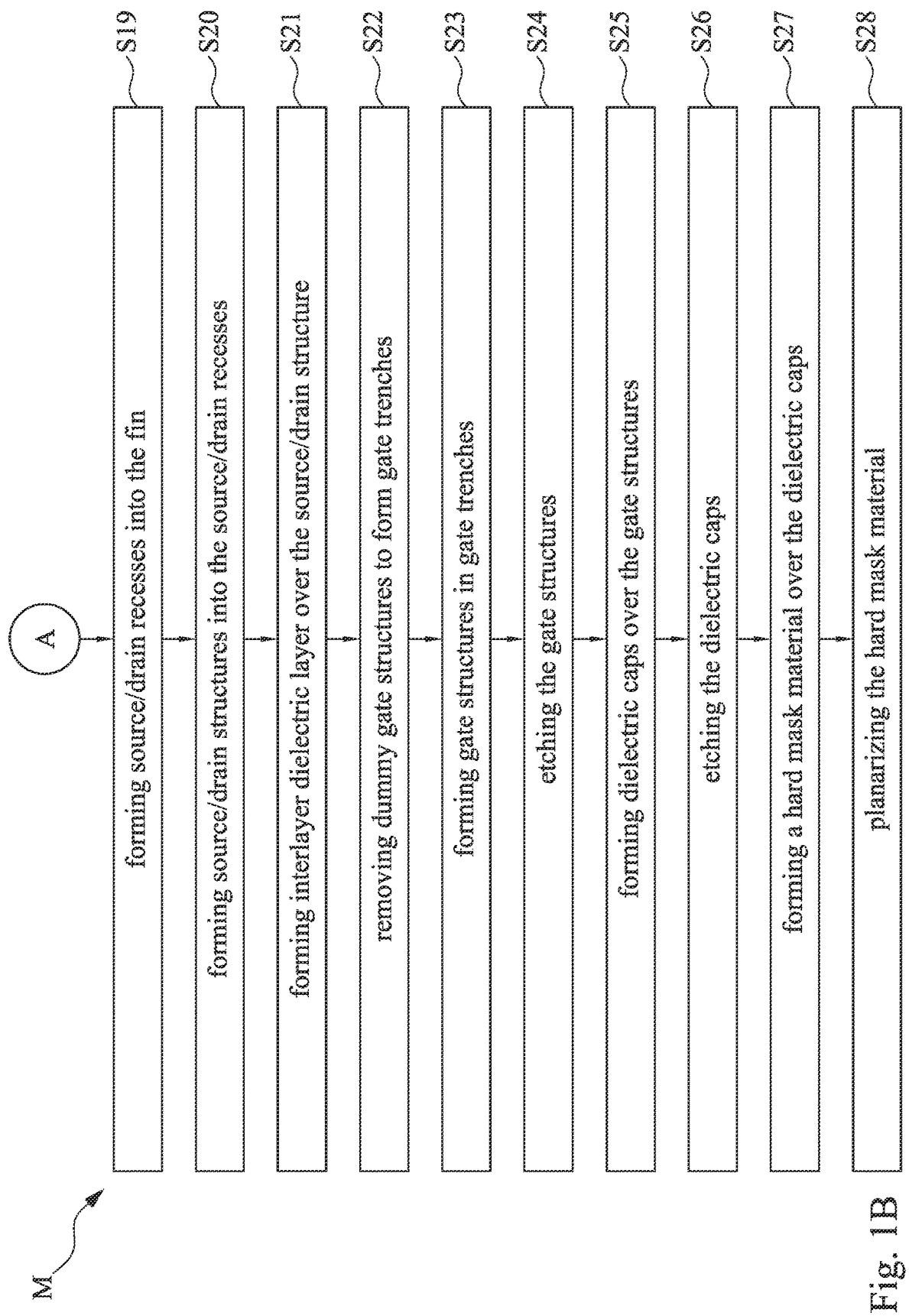

Referring now to FIGS. 1A and 1B, illustrated are an exemplary method M for fabrication of a semiconductor device in accordance with some embodiments, in which the fabrication includes the improved MGEB process. The method M includes a relevant part of the entire manufacturing process. It is understood that additional operations may be provided before, during, and after the operations shown by FIGS. 1A and 1B, and some of the operations described below can be replaced or eliminated for additional embodiments of the method. The order of the operations/processes may be interchangeable. The method M includes fabrication of a FinFET device. However, the fabrication of FinFET device is merely example for describing the improved MGEB process according to some embodiments of the present disclosure.

Figure 2:
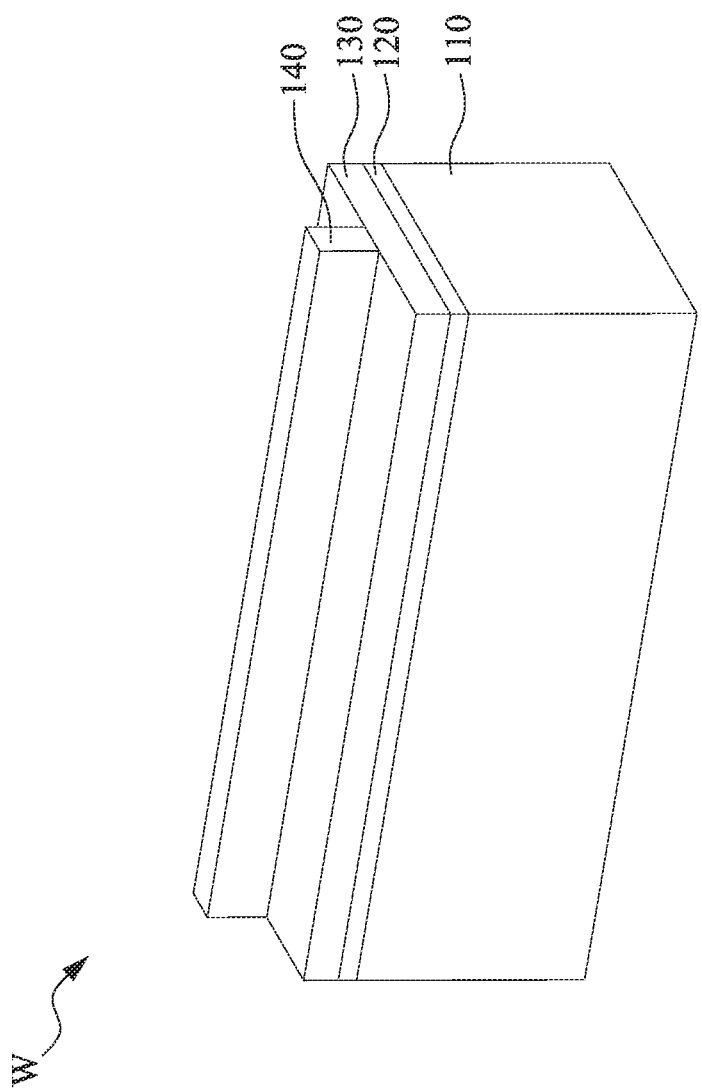
FIGS. 2-14 are perspective views of a local semiconductor device at various stages of fabrication in accordance with some embodiments of the present disclosure.

FIGS. 2 to 26B illustrate a wafer W at various stages of the method M according to some embodiments of the present disclosure. The method M begins at block S10 where a pad layer, a mask layer and a photoresist layer are formed in sequence over a substrate. Referring to FIG. 2, in some embodiments of block S10, a wafer W undergoes a series of deposition and photolithography processes, such that a pad layer 120, a mask layer 130 and a patterned photoresist layer 140 are formed on a substrate 110 of the wafer W. In some embodiments, the substrate 110 is a semiconductor substrate, such as a bulk semiconductor, a semiconductor-on-insulator (SOI) substrate, or the like. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the pad layer 120 is a thin film including silicon oxide formed using, for example, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, for example, using low-pressure chemical vapor deposition (LPCVD) or plasma enhanced chemical vapor deposition (PECVD). The mask layer 130 is used as a hard mask during subsequent photolithography processes. A photoresist layer 140 is formed on the mask layer 130 and is then patterned, forming openings in the photoresist layer 140, so that regions of the mask layer 130 are exposed.

Figure 3:
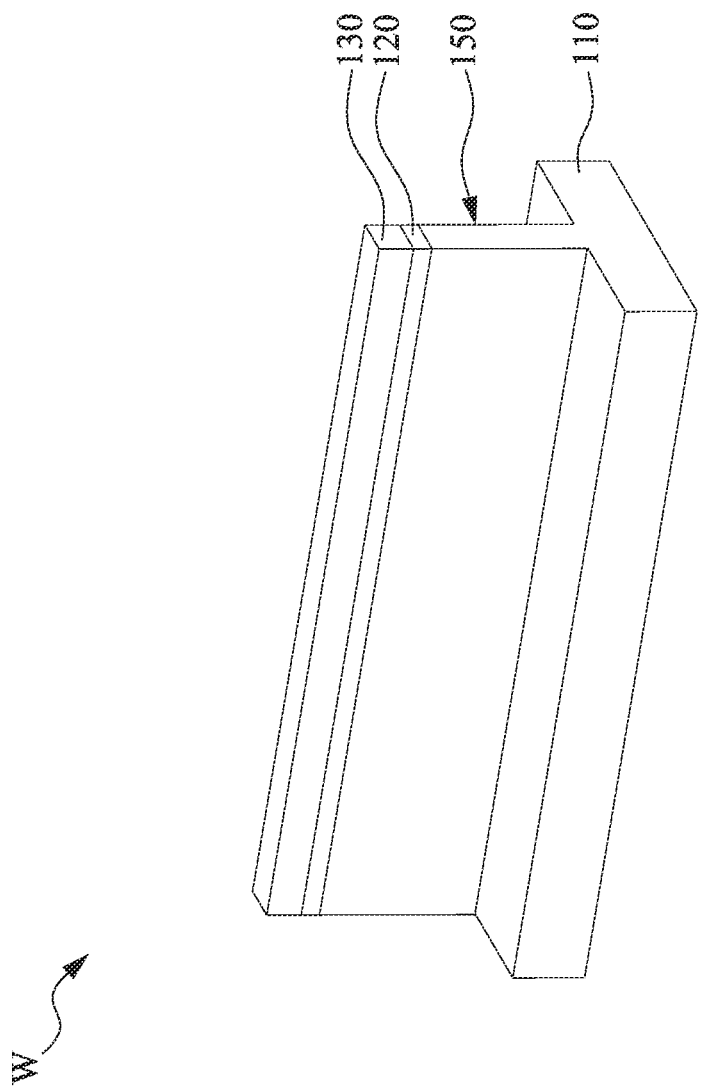

Returning to FIG. 1A, the method M then proceeds to block S11 where the substrate is patterned to form one or more fins. With reference to FIG. 3, in some embodiments of block S11, the mask layer 130 and pad layer 120 are etched through the photoresist layer 140, exposing underlying substrate 110. The exposed substrate 110 is then etched, forming trenches T. A portion of the substrate 110 between neighboring trenches T can be referred to as a fin 1150. After etching the substrate 110, the photoresist layer 140 is removed. Next, a cleaning step may be optionally performed to remove a native oxide of the semiconductor substrate 1110. The cleaning may be performed using diluted hydrofluoric (HF) acid, for example.

Figure 4:
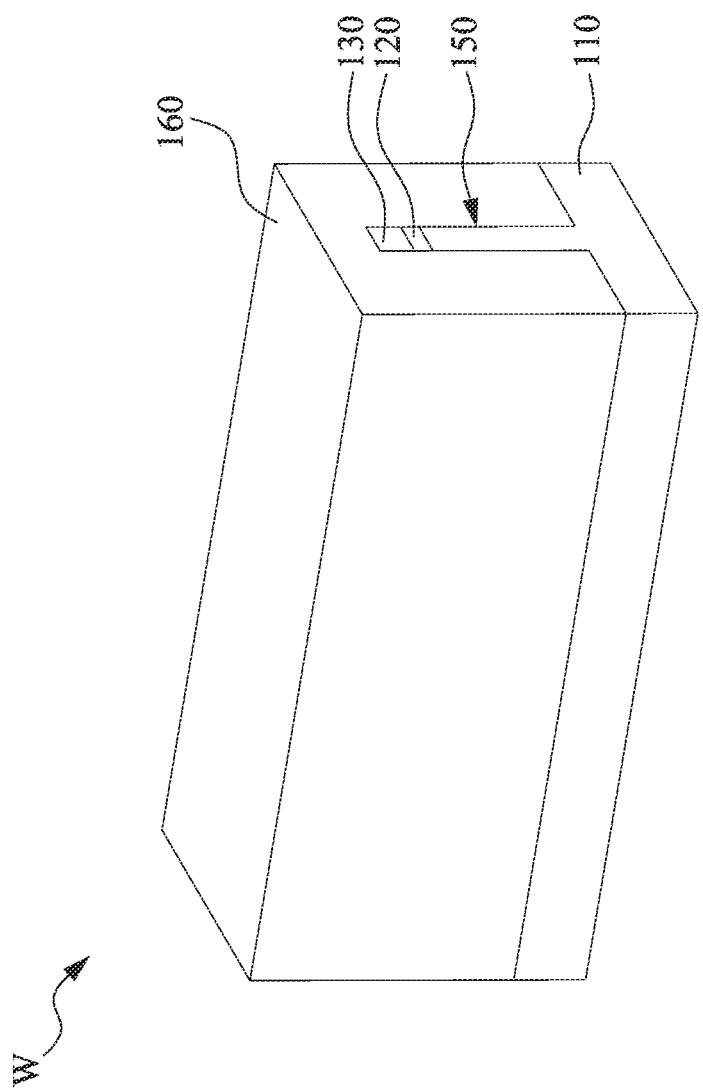

Returning to FIG. 1A, the method M then proceeds to block S12 where an isolation dielectric is formed to cover the fin. With reference to FIG. 4, an isolation dielectric 160 is formed to overfill the trenches and cover the fin 150. The isolation dielectric 160 in the trenches T can be referred to as a shallow trench isolation (STI) structure. In some embodiments, the isolation dielectric 160 is made of silicon oxide, silicon nitride, silicon oxynitride, fluoride-doped silicate glass (FSG), or other low-K dielectric materials. In some embodiments, the isolation dielectric 160 may be formed using a high-density-plasma (HDP) chemical vapor deposition (CVD) process, using silane ($SiH_4$) and oxygen ($O_2$) as reacting precursors. In some other embodiments, the isolation dielectric 160 may be formed using a sub-atmospheric CVD (SACVD) process or high aspect-ratio process (HARP), in which process gases may include tetraethyl-orthosilicate (TEOS) and ozone ($O_3$). In yet other embodiments, the isolation dielectric 160 may be formed using a spin-on-dielectric (SOD) process, such as hydrogen silsesquioxane (HSQ) or methyl silsesquioxane (MSQ). Other processes and materials may be used. In some embodiments, the isolation dielectric 160 can have a multi-layer structure, for example, a thermal oxide liner layer with silicon nitride formed over the liner. Thereafter, a thermal annealing may be optionally performed to the isolation dielectric 160.

Figure 5:
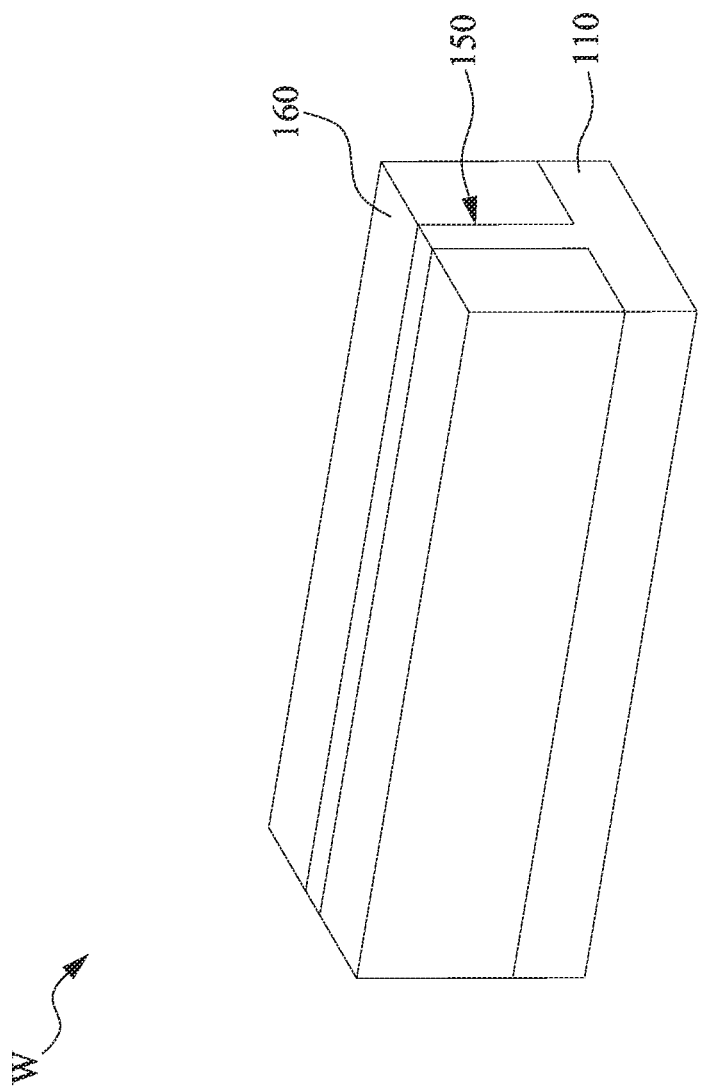

Returning to FIG. 1A, the method M then proceeds to block S13 where a planarization process is performed to the isolation dielectric. With reference to FIG. 5, a planarization process such as chemical mechanical polish (CMP) is performed to remove the excess isolation dielectric 160 over the fin 150. In some embodiments, the planarization process may also remove the mask layer 130 and the pad layer 120 such that a top surface of the fin 150 is exposed. In some other embodiments, the planarization process stops when the mask layer 130 is exposed. In such embodiments, the mask layer 130 may act as the CMP stop layer in the planarization. If the mask layer 130 and the pad layer 120 are not removed by the planarization process, the mask layer 130, if formed of silicon nitride, may be remove by a wet process using hot $H_3PO_4$, and the pad layer 120, if formed of silicon oxide, may be removed using diluted HF.

Figure 6:
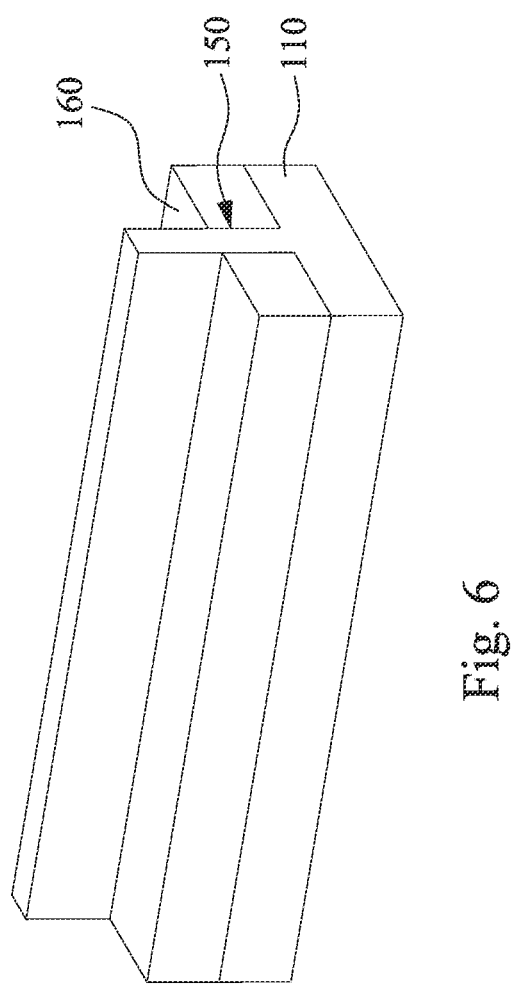

Returning to FIG. 1A, the method M then proceeds to block S14 where the isolation dielectric is recessed. With reference to FIG. 6, the isolation dielectric 160 is recessed, for example, through an etching operation, in which diluted HF, SiCoNi (including HF and $NH_3$), or the like, may be used as the etchant. After recessing the isolation dielectric 160, a portion of the fin 150 is higher than a top surface of the isolation dielectric 160.

It is understood that the blocks S10-S14 described above are merely an example of how the tin 150 and the STI structure 160 are formed. In other embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fin. For example, the semiconductor fin 150 can be recessed, and a material different from the recessed semiconductor fin 150 is epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in-situ doped during growth, which may obviate prior implanting of the fins although in-situ and implantation doping may be used together. In some embodiments, the semiconductor fin 150 may include silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

Figure 7:
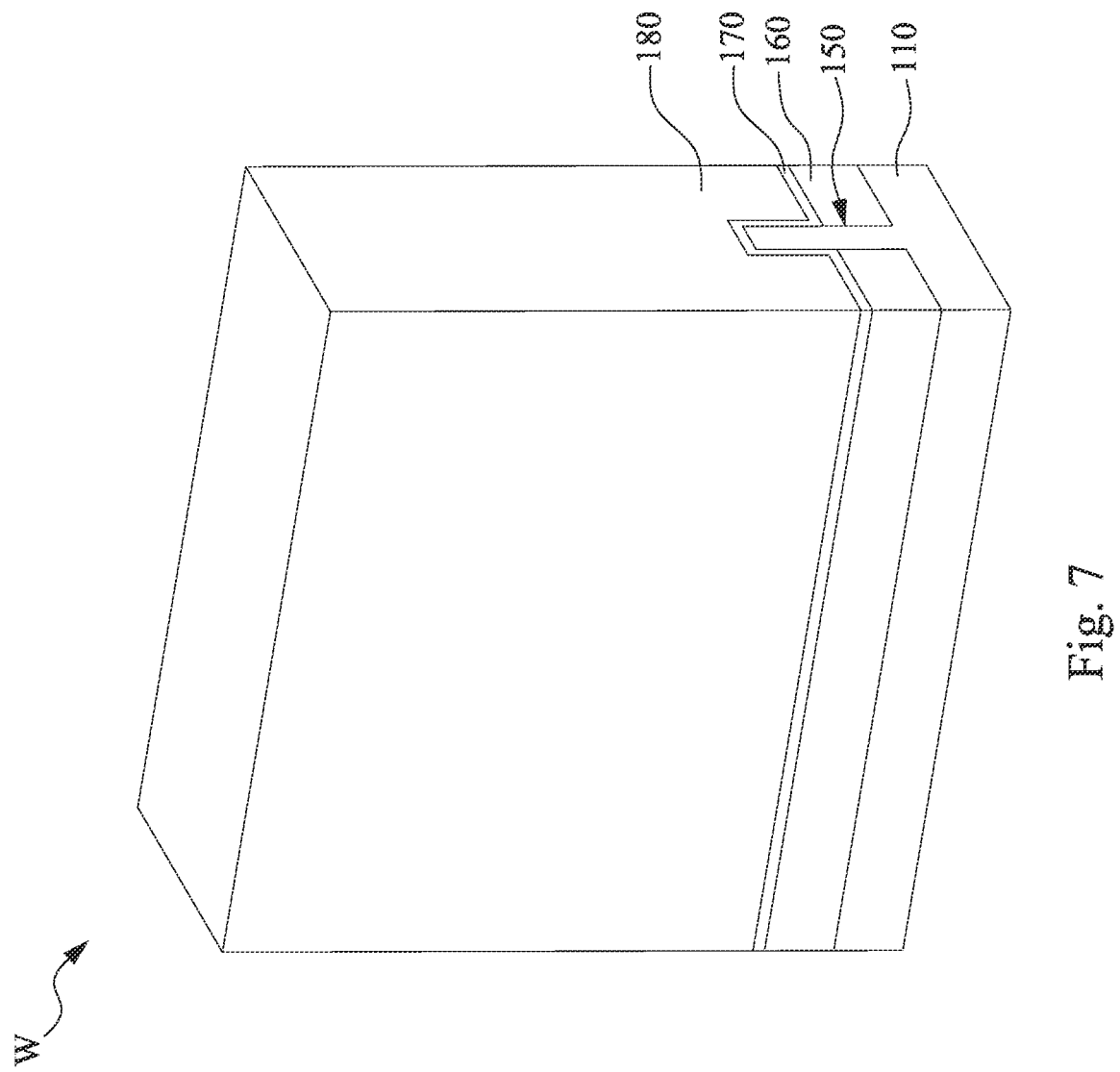

Returning to FIG. 1A, the method M then proceeds to block S15 where a gate dielectric layer and a dummy gate electrode layer are formed in sequence over the fin. With reference to FIG. 7, a gate dielectric layer 170 is blanket formed over the substrate 110 to cover the semiconductor fin 150 and the isolation dielectric 160, and a dummy gate electrode layer 180 is formed over the gate dielectric layer 170. In some embodiments, the gate dielectric layer 170 is made of high-k dielectric materials, such as metal oxides, transition metal-oxides, or the like. Examples of the high-k dielectric material include, but are not limited to, hafnium oxide (HfO$_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina (HfO$_2$—Al$_2$O$_3$) alloy, or other applicable dielectric materials. In some embodiments, the gate dielectric layer 170 is an oxide layer. The gate dielectric layer 170 may be formed by a deposition processes, such as chemical vapor deposition (CVD), physical vapor deposition (PVD), atomic layer deposition (ALD), plasma enhanced CND (PECVD) or other suitable techniques.

In some embodiments, the dummy gate electrode layer 180 may include polycrystalline-silicon (poly-Si), polycrystalline silicon-germanium (poly-SiGe), metallic nitrides, metallic silicides, metallic oxides, or metals. In some embodiments, the dummy gate electrode layer 180 includes a metal-containing material such as TiN, TaN, TaC, Co, Ru, Al, combinations thereof, or multi-layers thereof. The dummy gate electrode layer 180 may be deposited by CVD, physical vapor deposition (PVD), sputter deposition, or other techniques suitable for depositing conductive materials.

Figure 8:
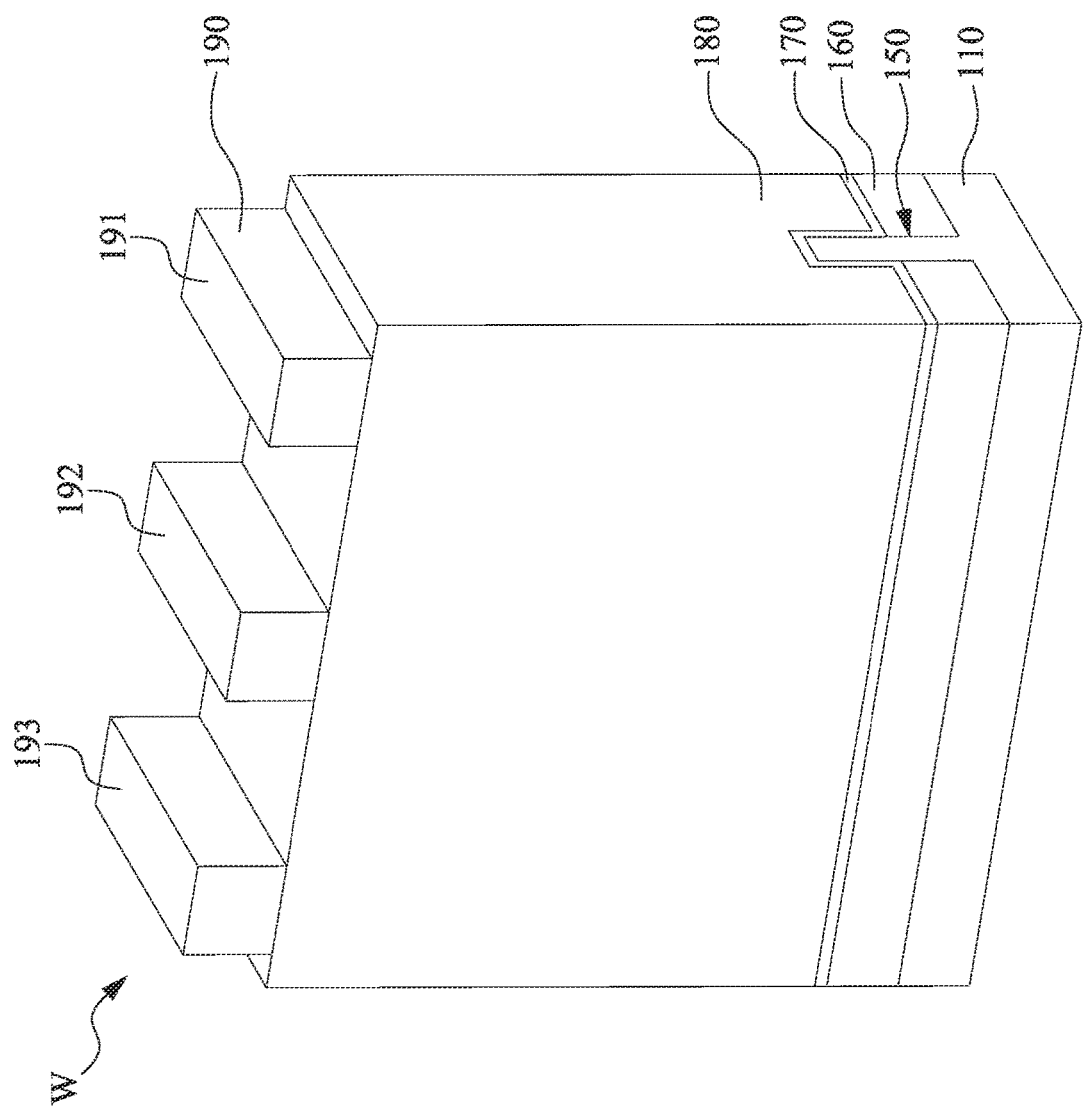

Returning to FIG. 1A, the method M then proceeds to block S16 where a patterned mask layer is formed over the dummy gate electrode layer. With reference to FIG. 8, in some embodiments of block S16, a patterned mask layer 190 is formed over the dummy gate electrode layer 180 and then patterned to form separated mask portions. The patterned mask layer 190 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 9:
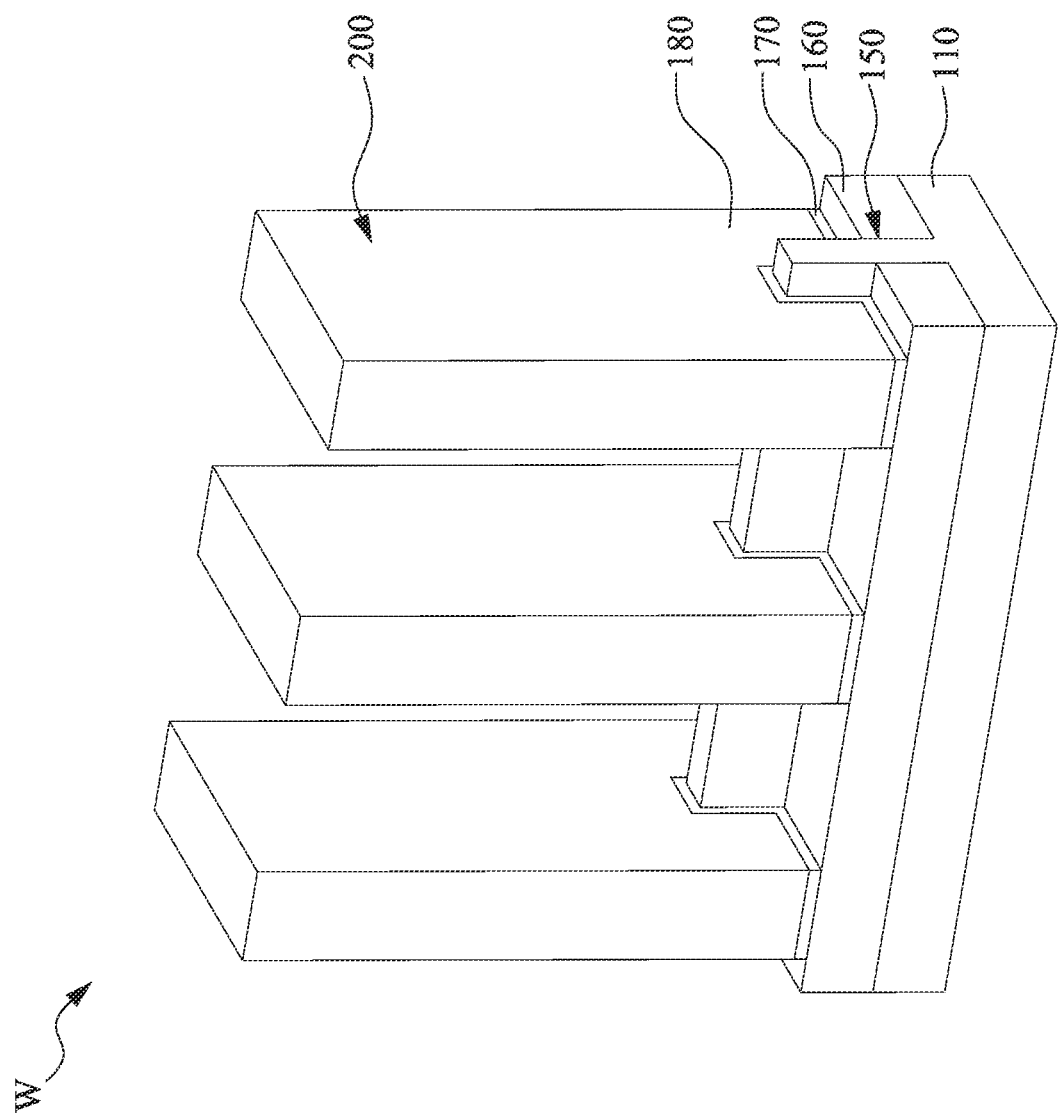

Returning to FIG. 1A, the method M then proceeds to block S17 where the dummy gate electrode layer and the gate dielectric layer are patterned to form dummy gate structures. With reference to FIG. 9, in some embodiments of block S17, one or more etching processes are performed to form dummy gate structures 200 wrapping around the semiconductor fin 150 using the patterned mask 190 as an etching mask, and the patterned mask layer 190 is removed after the etching. Each dummy gate structure includes a gate dielectric layer 170 and a dummy gate electrode layer 180 over the gate dielectric layer 170. The dummy gate structures 200 have substantially parallel longitudinal axes that are substantially perpendicular to a longitudinal axis of the semiconductor fin 150. The dummy gate structures 200 will be replaced with a replacement gate structure using a "gate-last" or replacement-gate process.

Figure 10:
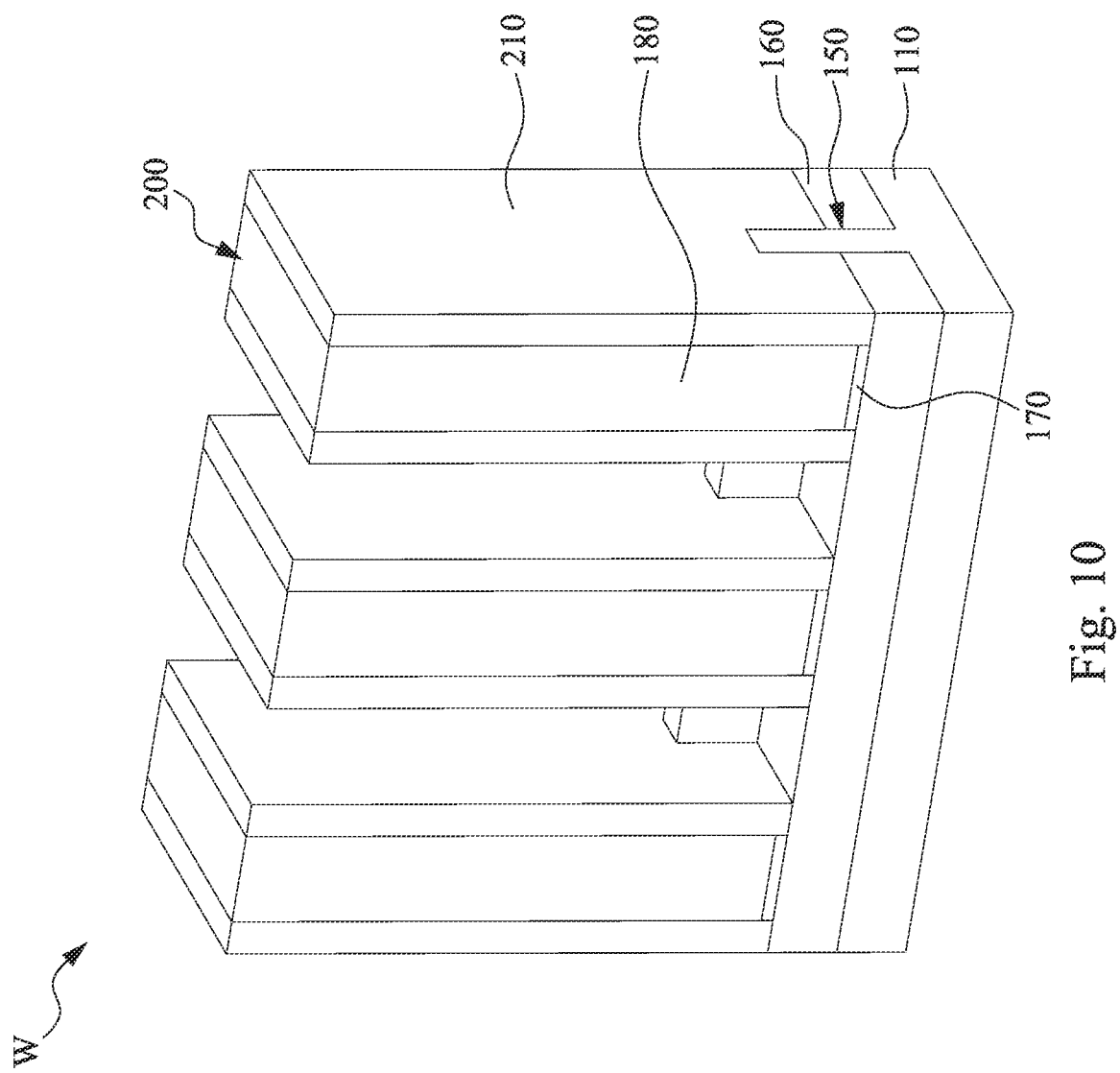

Returning to FIG. 1A, the method M then proceeds to block S18 where gate spacers are formed along sidewalk of the dummy gate structures. With reference to FIG. 10, in some embodiments of block S18, gate spacers 210 are formed along sidewalk of the dummy gate structures 200. In some embodiments, the gate spacers 210 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), ow-k dielectric materials, or other suitable dielectric materials. The gate spacers 210 may include a single layer or multilayer structure made of different dielectric materials. The method of forming the gate spacers 210 includes blanket forming a dielectric layer on the structure shown in FIG. 9 using, for example, CVD, PVD or ALD, and then performing an etching process such as anisotropic etching to remove horizontal portions of the dielectric layer. The remaining portions of the dielectric layer on sidewalls of the dummy gate structures 200 can serve as the gate spacers 210. In some embodiments, the gate spacers 210 may be used to offset subsequently formed doped regions, such as source/drain regions. The gate spacers 210 may further be used for designing or modifying the source/drain region profile.

Figure 11:
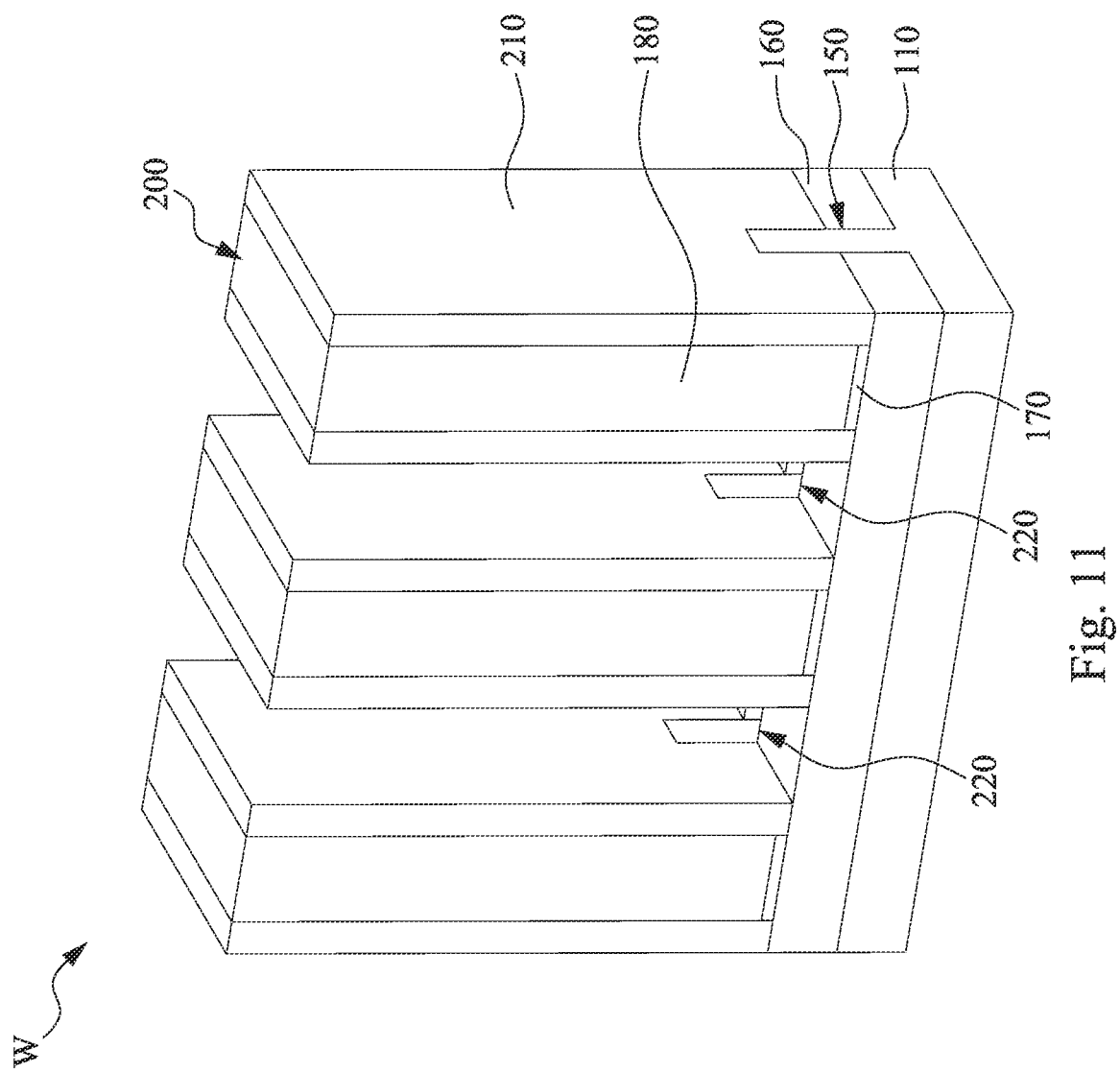

Referring to FIG. 1B, the method M then proceeds to block S19 where source/drain recesses are formed into the fin. With reference to FIG. 11, in some embodiments of block S19, portions of the semiconductor fin 150 not covered by the dummy gate structures 200 and the gate spacers 210 are recessed to form recesses 220.

Formation of the recesses 220 may include a dry etching process, a wet etching process, or combination dry and wet etching processes. This etching process may include reactive ion etch (RIE) using the dummy gate structures 200 and gate spacers 210 as masks, or by any other suitable removal process. After the etching process, a pre-cleaning process may be performed to clean the recesses 220 with hydrofluoric acid (HF) or other suitable solution in some embodiments.

Figure 12:
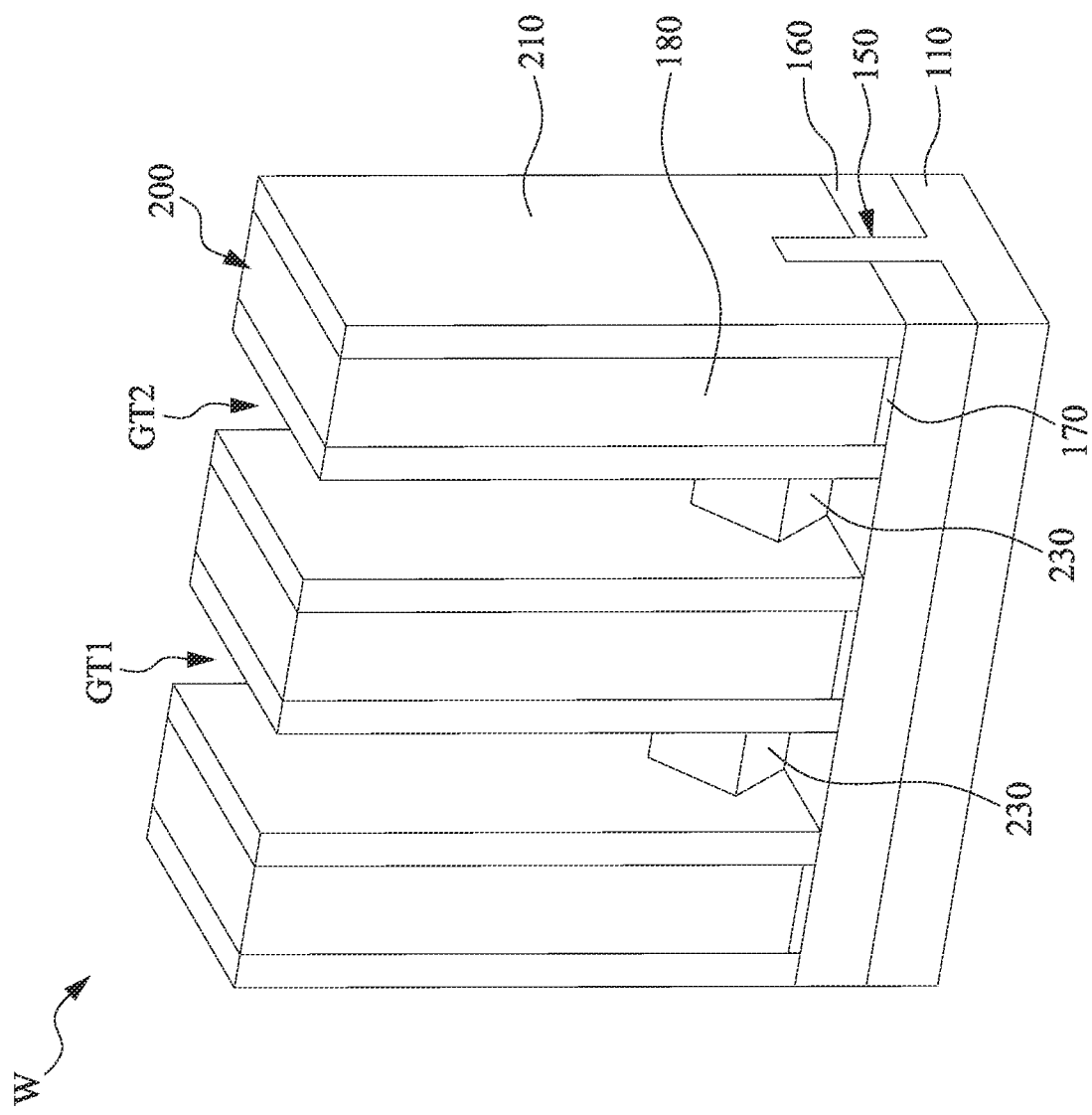

Returning to FIG. 1B, the method M then proceeds to block S20 where source/drain structures are formed into the recesses. With reference to FIG. 12, in some embodiments of block S20, epitaxial source/drain structures 230 are respectively formed in the recesses 220 (see FIG. 11). The epitaxial source/drain structures 230 may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fins 150. In some embodiments, lattice constants of the epitaxial source/drain structures 230 are different from that of the semiconductor fin 150, so that the channel region between the epitaxial source/drain structures 230 can be strained or stressed by the epitaxial source/drain structures 230 to improve carrier mobility of the semiconductor device and enhance the device performance.

The epitaxy process includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 150 (e.g., silicon, silicon germanium, silicon phosphate, or the like). The epitaxial source/drain structures 230 may be in-situ doped. The doping species include p-type dopants, such as boron or BF$_2$; n-type dopants, such as phosphorus or arsenic; and/or other suitable dopants including combinations thereof. If the epitaxial source/drain structures 230 are not in-situ doped, an implantation process is performed to dope the epitaxial source/drain structures 230. One or more annealing processes may be performed to activate the epitaxial source/drain structures 230. The annealing processes include rapid thermal annealing (RTA) and/or laser annealing processes.

Figure 13:
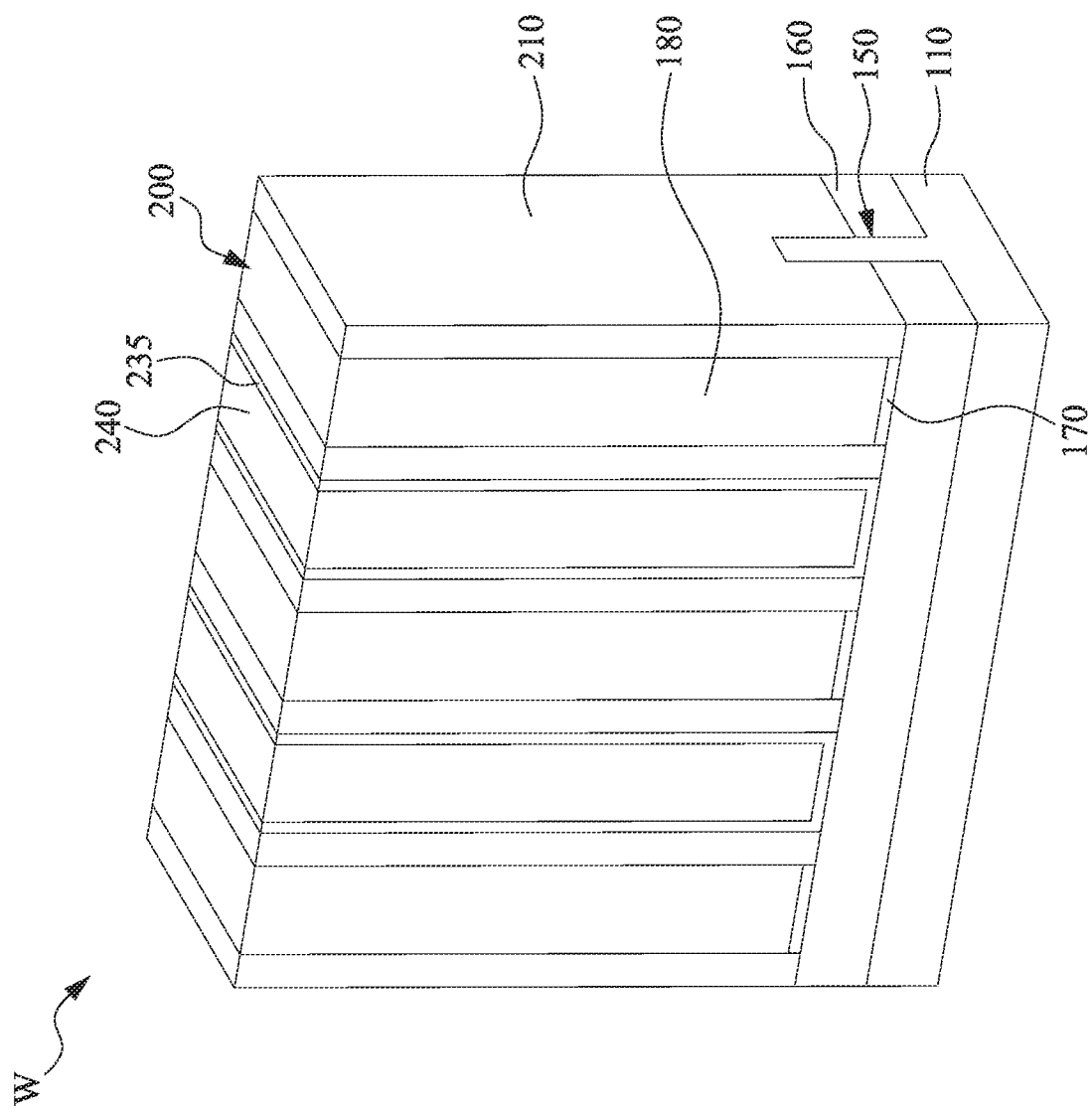

Returning to FIG. 1B, the method M then proceeds to block S21 where a contact etch stop layer (CESL) and an interlayer dielectric (ILD) layer is formed over the source/ drain structures. With reference to FIG. 13, in some embodiments of block S21, a CESL 235 is formed over the source/drain structures 230, the dummy gate structures 200 and the gate spacers 210, and an ILD layer 240 is formed over the CESL 235, followed by performing a CMP process to remove excessive material of the IUD layer 240 and CESL 235 to expose the dummy gate structures 200. The CMP process may planarize a top surface of the ILD layer 240 with top surfaces of the dummy gate structures 200 and gate spacers 210. In some embodiments, the ILD layer 240 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 240 may be formed using, for example, CVD, ALD, spin-on-glass (SOG) or other suitable techniques. In some embodiments, the CESL 235 includes silicon nitride, silicon oxynitride or other suitable materials. The CESL 235 can be formed using, for example, plasma enhanced CVD, low pressure CVD, ALD or other suitable techniques.

Figure 14:
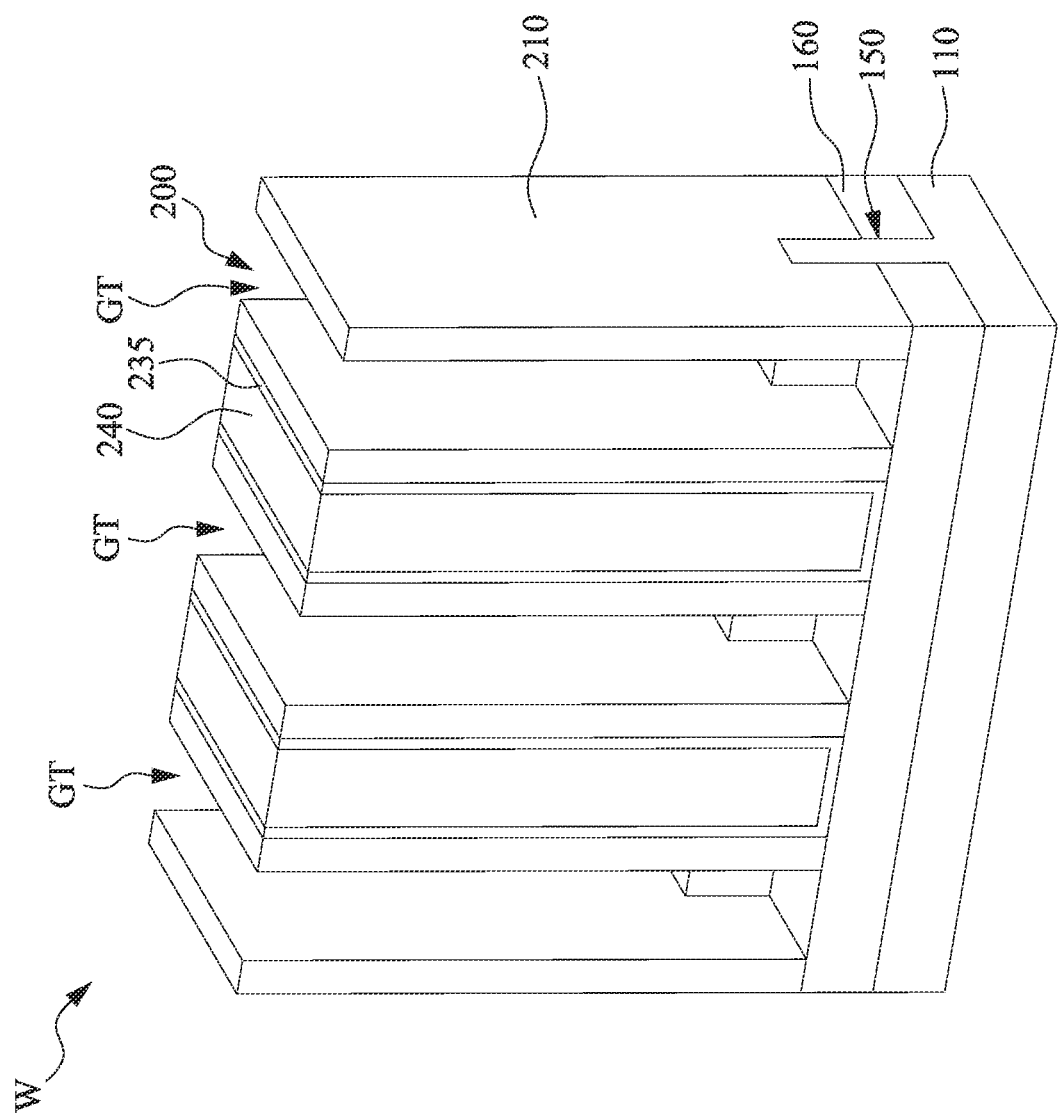

Returning to FIG. 1B, the method M then proceeds to block S22 where the dummy gate structures are removed to form gate trenches. With reference to FIG. 14, in some embodiments of block S22, dummy gate structures 200 (as shown in FIG. 13) are removed to form gate trenches GT with the gate spacers 210 as their sidewalls. Widths of the gate trenches GT are associated with the corresponding dummy gate structures 200, In some embodiments, the dummy gate structures 200 are removed by performing a first etching process and performing a second etching process after the first etching process. In some embodiments, the dummy gate electrode layer 180 (as shown in FIG. 13) is mainly removed by the first etching process, and the gate dielectric layer 170 (as shown in FIG. 13) is mainly removed by the second etching process that employs a different etchant than that used in the first etching process. In some embodiments, the dummy gate electrode layer 180 is removed, while the gate dielectric layer 170 remains in the gate trenches GT.

Figure 15A:
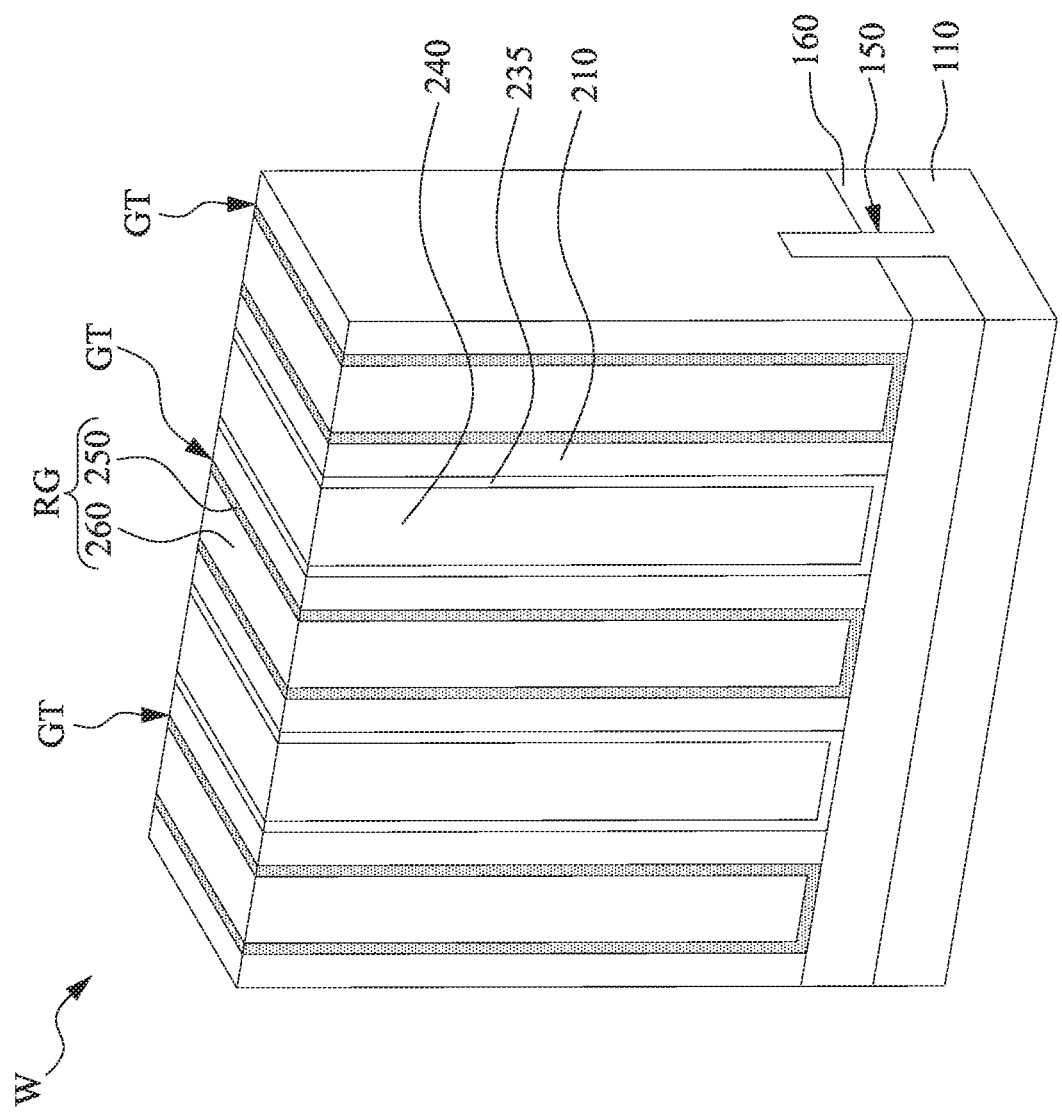
Figure 15B:
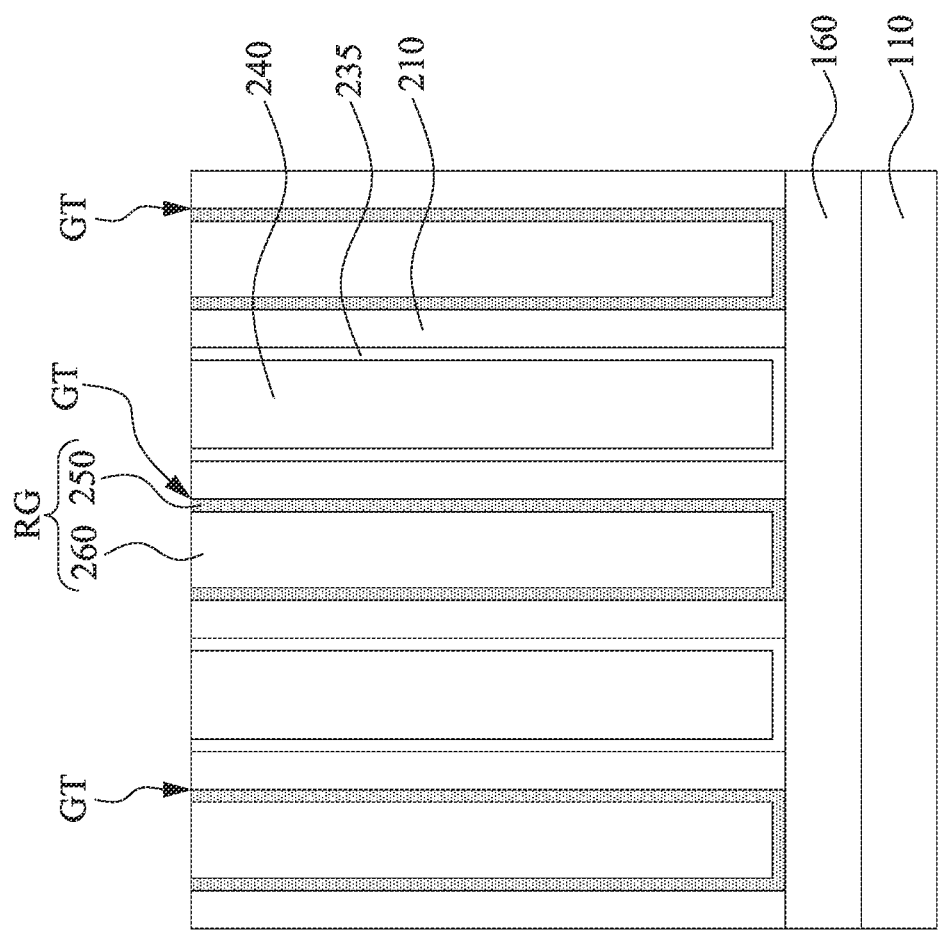

Returning to FIG. 1B, the method M then proceeds to block S23 where gate structures are formed in gate trenches. Reference is made to FIGS. 15A and 15B, in which FIG. 15B is a side view of the wafer W in FIG. 15A. In some embodiments of block S23, replacement gate structures RG are respectively formed in the gate trenches GT (as shown in FIG. 14).

An exemplary method of forming these replacement gate structures may include blanket forming a gate dielectric layer over the wafer W, forming one or more work function metal layers over the blanket gate dielectric layer, forming a fill metal layer over the one or more work function metal layers, and performing a CMP process to remove excessive materials of the fill metal layer, the one or more work function metal layers and the gate dielectric layer outside the gate trenches GT. As a result of this method, the replacement gate structures RG each include a gate dielectric layer 250 and a metal gate electrode 260 wrapped around by the gate dielectric layer 250.

In some embodiments, the gate dielectric layer 250 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 250 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 250 may have a multilayer structure such as one layer of silicon oxide (e.g., interfacial layer) and another layer of high-k material. In some embodiments, the gate dielectric layer 250 is made of the same material because they are formed from the same dielectric layer blanket deposited over the substrate 110.

The metal gate electrode 260 includes suitable work function metals to provide suitable work functions. In some embodiments, the metal gate electrode 260 may include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the metal gate electrode 260 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the metal gate electrodes 260 are made of different work function metals so as to achieve suitable work functions in some embodiments. In some embodiments, an entirety of the metal gate electrode 260 is a work function metal.

Returning to FIG. 1B, block S24 in the method M is directed to an MGEB process according to some embodiments of the present disclosure. In the present disclosure, the MGEB process is a plasma etching process employing one or more etchants such as a fluorine-containing gas (e.g., $CF_4$, $SF_6$, $CH_2F_2$, $CHF_3$, and/or $C_2F_6$) and/or a chlorine-containing gas (e.g., $Cl_2$, $CHCl_3$, $CCl_4$, $BCl_3$, and/or $SCl_4$).

Plasmas, in general, are partially ionized gas mixtures where a fraction of the atoms or molecules have lost an electron to produce positively charged ions. Electric and magnetic fields can be used to create plasmas and to control their behavior. Plasmas are generated through dissipation of the electrical power supplied to a gas mixture. The power is transferred to electrons and such energetic electrons then undergo collisions with atoms and molecules of the mixture to produce ions, more electrons and radicals by initiating processes such as ionization, excitation and dissociation. Electron impact can ionize an atom or molecule in the plasma or dissociate a molecule producing free radicals. Free radicals may recombine with appropriate gas phase species to reproduce the state they originated from or create other species.

By way of example, the plasma etching process used in the MGEB process uses a gas mixture including an argon (Ar) gas, a boron trichloride (BCl$_3$) gas, a Cl$_2$ gas, and the like. Electron impact dissociation of BCl$_3$ produces BCl$_n$ radicals (n=1 or 2) and chlorine radicals to selectively etch the gate dielectrics and work function metals. Moreover, some chlorine radicals recombine with BCl$_n$ radicals to form BCl$_3$ gas. Further, the BCl$_n$ radicals may form BCl$_x$ polymers (x is a positive integer). Formation of the BCl$_x$ polymers is equivalently referred to as "polymerization." Conditions of the plasma etching process are tuned such that etching phenomenon is dominant over polymerization phenomenon in a plasma chamber.

In some embodiments where HfO$_2$ is used as the gate dielectrics, an example etching mechanism of the HfO$_2$ in Ar/BCl$_3$/Cl$_2$ plasmas is described as follows. For example, Hf—O bond breaking is the first step followed by Cl adsorption by Hf atoms that produces solid HfCl$_x$ and BCl$_x$ adsorption by bond cleaved O that generated solid B$_m$OCl$_n$. Later HfCl$_x$ and B$_m$OCl$_n$ solids are etched as volatile HfCl$_x$ (x=2-4), BOCl, B$_2$OCl$_3$ and B$_2$OCl$_4$ by ion impact reactions. In some embodiments where TiN is used as work function metals, an example etching mechanism of TiN in Ar/BCl$_3$/Cl$_2$ plasmas is described as follows. For example, TiN etching begins with ion bombardment to break Ti—N bonds and liberate N atoms. The Ti site then absorbs Cl leading to formation of TiCl$_n$ (n=1-3) on a surface of the TiN layer, Ion bombardment removes these compounds as TiCl$_n$ gas. TiN surface can itself absorb Cl to produce TiNCl on the surface of TiN layer, followed by energetic ion bombardment containing Cl to remove Ti from TiNCl as volatile TiCl$_n$ gas.

Figure 27:
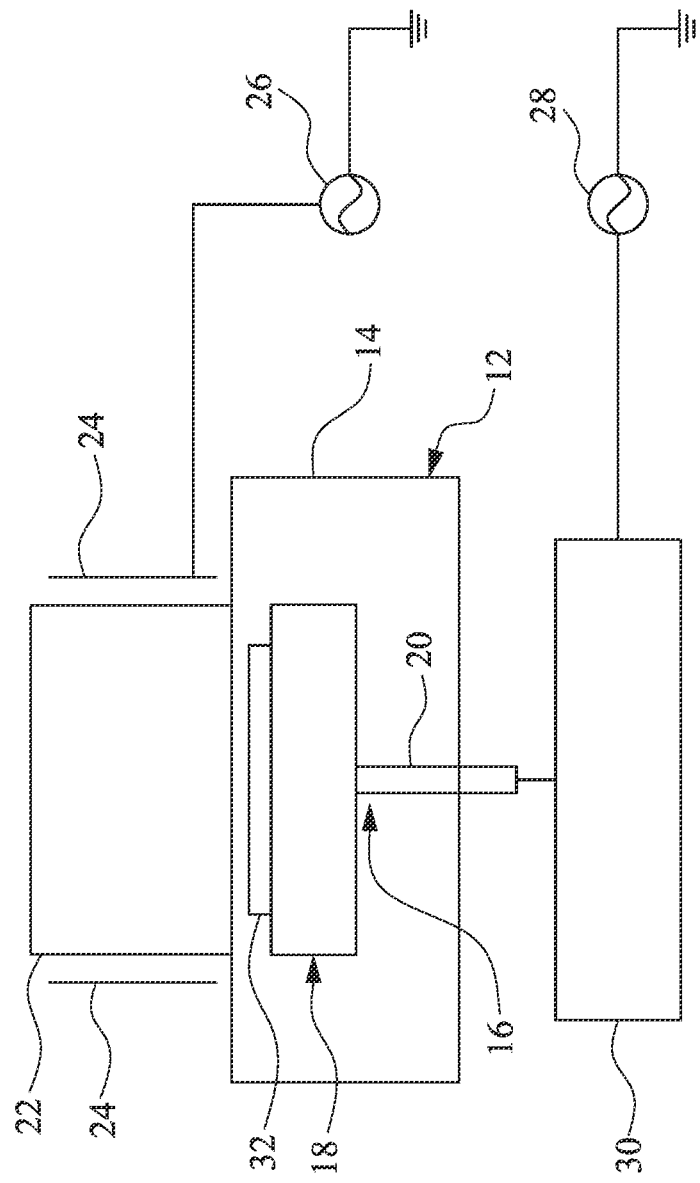
FIG. 27 is a cross-sectional view of a plasma processing apparatus in accordance with some embodiments of the present disclosure.

In certain embodiments of the present disclosure, the MGEB process is a multi-step plasma etching process involving a non-zero bias etching step and a zero-bias etching step in-situ performed in the same plasma process apparatus (i.e. performed in the same chamber). In greater detail, Referring now to FIG. 27, illustrated is a cross-sectional view of an exemplary plasma processing apparatus 10 in some embodiments of the present disclosure. In some embodiments, the plasma processing apparatus 10 may contain an inductively-coupled plasma (ICP) as a plasma source and a RF power supply as a bias power source. As shown in FIG. 27, the plasma processing apparatus 10 includes a chamber base 12 having a typically grounded chamber wall 14. The chamber base 12 is closed by a removable lid or a cover 22 and contains a pedestal assembly 18 which can typically be raised and lowered on a shaft 20 by actuation of a pedestal lift assembly 16. An inductively-coupled plasma coil 24 surrounds the lid 22 and is connected to an RF source power supply 26. The pedestal assembly 18 is connected, through an RF match network 30 which matches impedances, to an RF power supply 28. During operation of the plasma processing apparatus 10, the pedestal assembly 18 supports a wafer 32 in the chamber base 12. A plasma-generating source gas, such as argon, is introduced into the plasma processing apparatus 10 by a gas supply (not shown). Volatile reaction products and unreacted plasma species are removed from the plasma processing apparatus 10 by a gas removal mechanism (not shown). Source power such as a high voltage signal, provided by the RF source power supply 26, is applied to the inductively-coupled plasma coil 24 to ignite and sustain a plasma in the plasma processing apparatus 10. Ignition of a plasma in the plasma processing apparatus 10 is accomplished primarily by electrostatic coupling of the inductively-coupled plasma coil 24 with the source gas, due to the large-magnitude voltage applied to the inductively-coupled plasma coil 24 and the resulting electric fields produced in the plasma processing apparatus 10. Once ignited, the plasma is sustained by electromagnetic induction effects associated with time-varying magnetic fields produced by the alternating currents applied to the inductively-coupled plasma coil 24. Through the RF power supply 28, the pedestal assembly 18 is typically electrically biased to provide to the wafer 32 ion energies that are independent of the RF voltage applied to the chamber 10 through the inductively-coupled plasma coil 24 and RF source power supply 26. This facilitates more precise control over the energies of the etchant ions that bombard the surface of the wafer 32. A non-zero bias etching can be provided by the ICP plasma source 26 with turning on the RF power source 28 during the non-zero bias etching step. On the contrary, a zero bias can be provided by the ICP plasma source 26 without turning on the RF power source 28 during the zero bias etching step. The non-zero bias etching step and the zero bias etching step result in different profile of the etched gate structures, as will be discussed further below. In some embodiments, the non-zero bias power is in a range from about 10 W to about 300 W. If the bias power is higher than about 300 W, the plasma might result in unwanted damage to the ILD layer 240 shown in FIGS. 16A and 16B. In some embodiments, the plasma processing apparatus 10 may also be an electron cyclotron resonance (ECR) apparatus, but the present disclosure is not limited thereto. In certain embodiments, the term "about" or "substantially" used in this context means greater or less than the stated value or the stated range of values by a percentage such as 5%, 10%, 15%, etc. of the stated values.

As used herein, the term "in-situ" is used to describe processes that are performed while a device or substrate remains within a processing system (e.g., including a load lock chamber, transfer chamber, processing chamber, or any other fluidly coupled chamber), and where for example, the processing system allows the substrate to remain under vacuum conditions. As such, the term "in-situ" may also generally be used to refer to processes in which the device or substrate being processed is not exposed to an external environment (e.g., external to the processing system).

In certain embodiments of block S24, with reference to FIGS. 16A-19B, the MGEB process is a cyclic process including at least one repetition of a non-zero bias etching step and a zero bias etching step. For example, it may perform a non-zero bias etching step (e.g., FIGS. 16A and 16B) followed by a zero bias etching step (e.g., FIGS. 17A and 17B), and repeats the non-zero bias etching step (e.g., FIGS. 18A and 18B) and the zero bias etching step (e.g., FIGS. 19A and 19B).

Figure 16A:
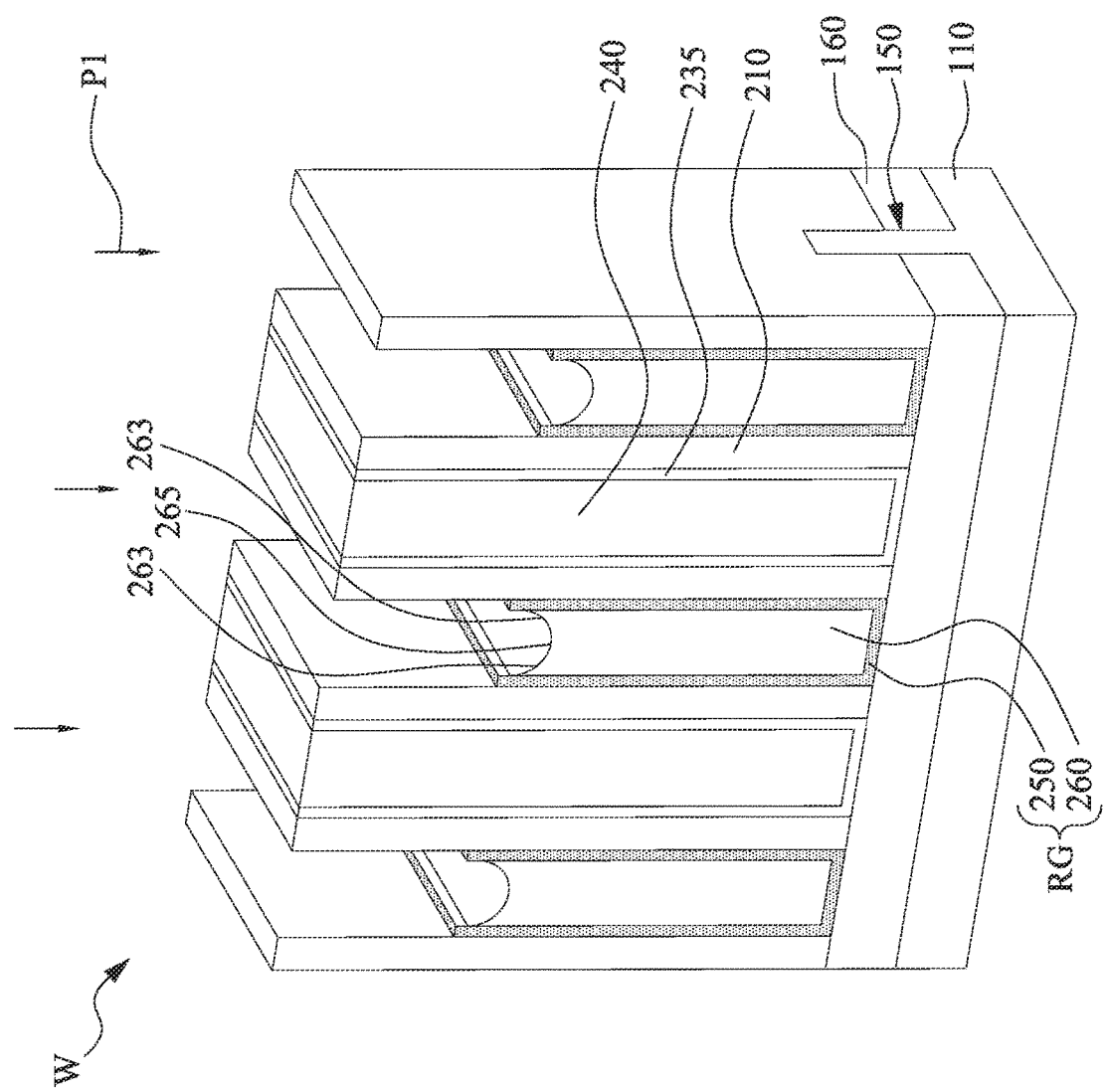
Figure 16B:
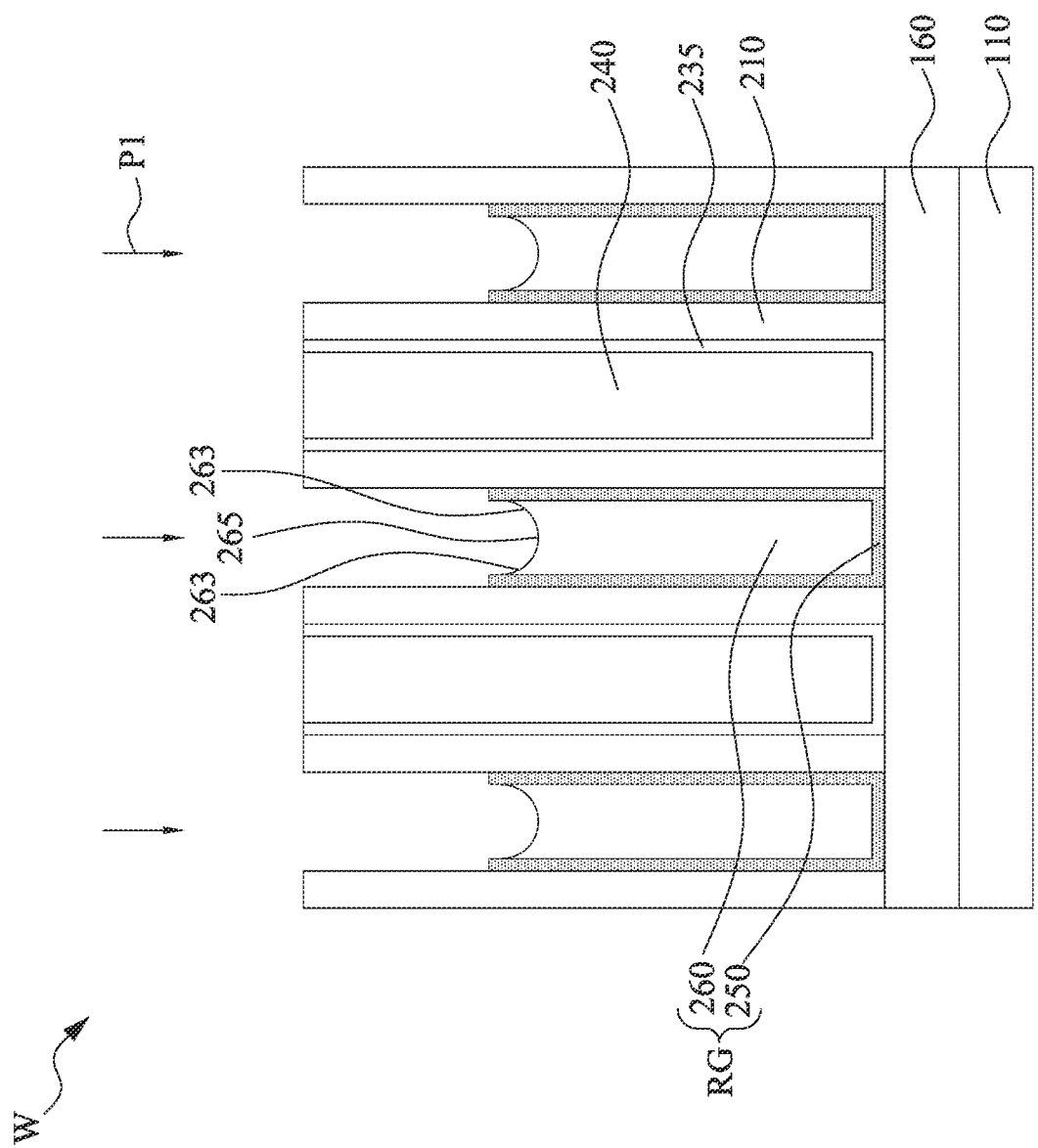

As shown in FIGS. 16A and 16B, the non-zero bias plasma etching step P1 is performed to thin down the gate structures RG, because the non-zero bias can drive more plasmas to the scaled down gate structures RG compared to zero bias. In some embodiments, the non-zero bias plasma etching step P1 uses a gas mixture of Cl$_2$, O$_2$, BCl$_3$, and Ar with a bias in a range from about 25V to about 1200V. Due to the nature of plasmas driven by non-zero bias, the non-zero bias etching step P1 exhibits slower etch rate at the regions close to the gate spacers 210 (e.g., peripheral regions of the gate structure RG) than that at regions farther away from the gate spacers 210 (e.g., a middle region or a central region of the gate structure RG). The etch rate difference leads to curved top surfaces of the resulting gate structure RG, which may be undesirable for subsequent deposition in the gate trenches.

In greater detail, during the non-zero bias plasma etching step P1, the etching rate of the metal gate electrode 260 adjacent to the gate spacer 210 (e.g., peripheral regions 263 of the metal gate electrode 260) is less than that away from the gate spacer 210 (e.g., central regions 265 of the metal gate electrode 260). In addition, during the non-zero bias plasma etching step P1, the etching rate of gate dielectric layer 250 is less than on the metal gate electrode 260. In other words, in the non-zero bias plasma etching step P1, a removed amount of the metal gate electrode 260 adjacent to the gate spacer 210 is less than a removed amount of the metal gate electrode 260 away from the gate spacer 210. A removed amount of the gate dielectric layer 250 is less than a removed amount of the metal gate electrode 260 adjacent to the gate spacer 210 for the process period of the non-zero bias plasma etching step P1. Hence, after the non-zero bias plasma etching step P1, a topmost portion of the remained gate dielectric layer 250 is higher than a topmost portion of the remained metal gate electrode 260. The remained metal gate electrode 260 is recessed toward the substrate 110 and results in a concave profile.

Figure 17A:
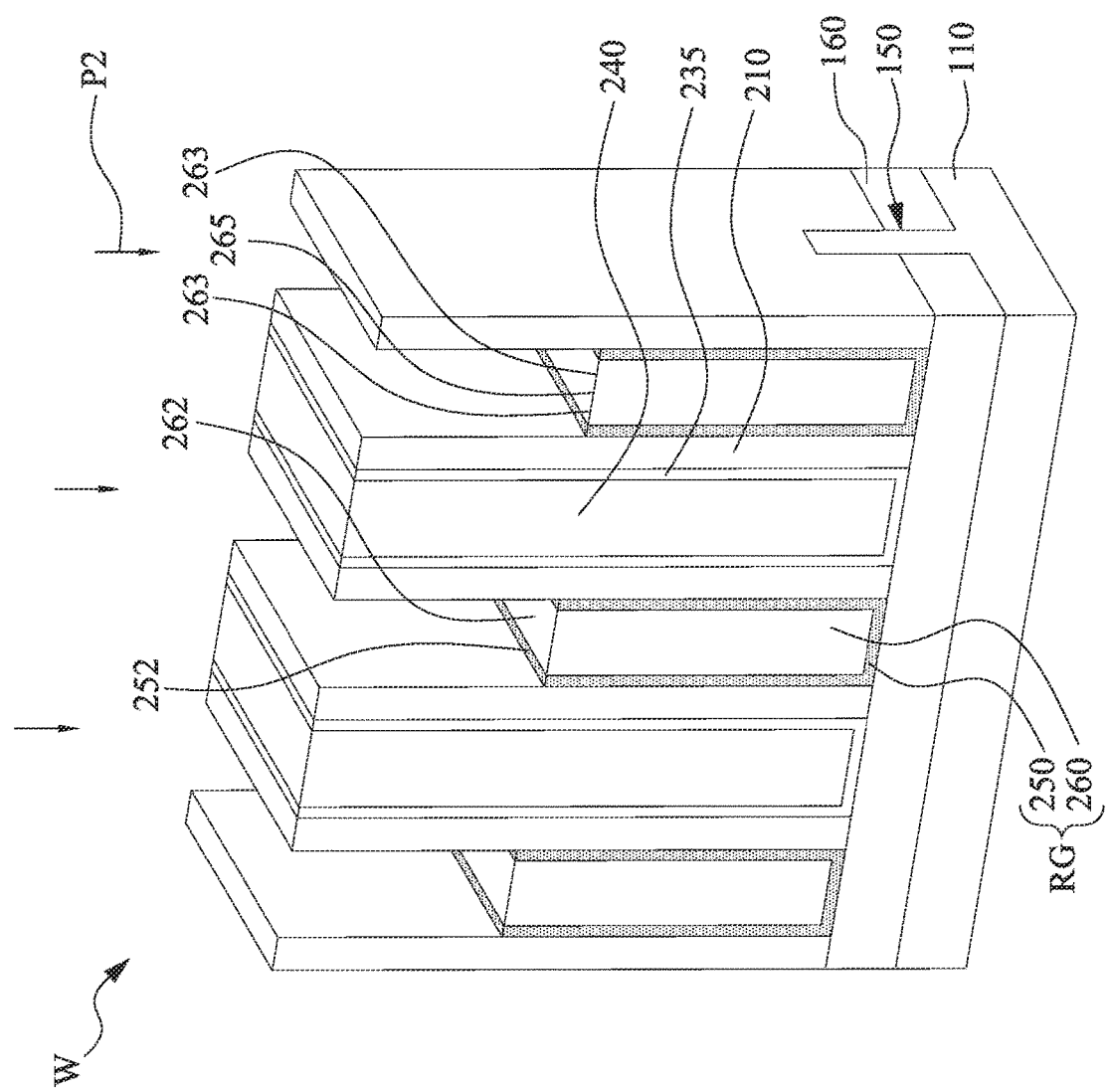
Figure 17B:
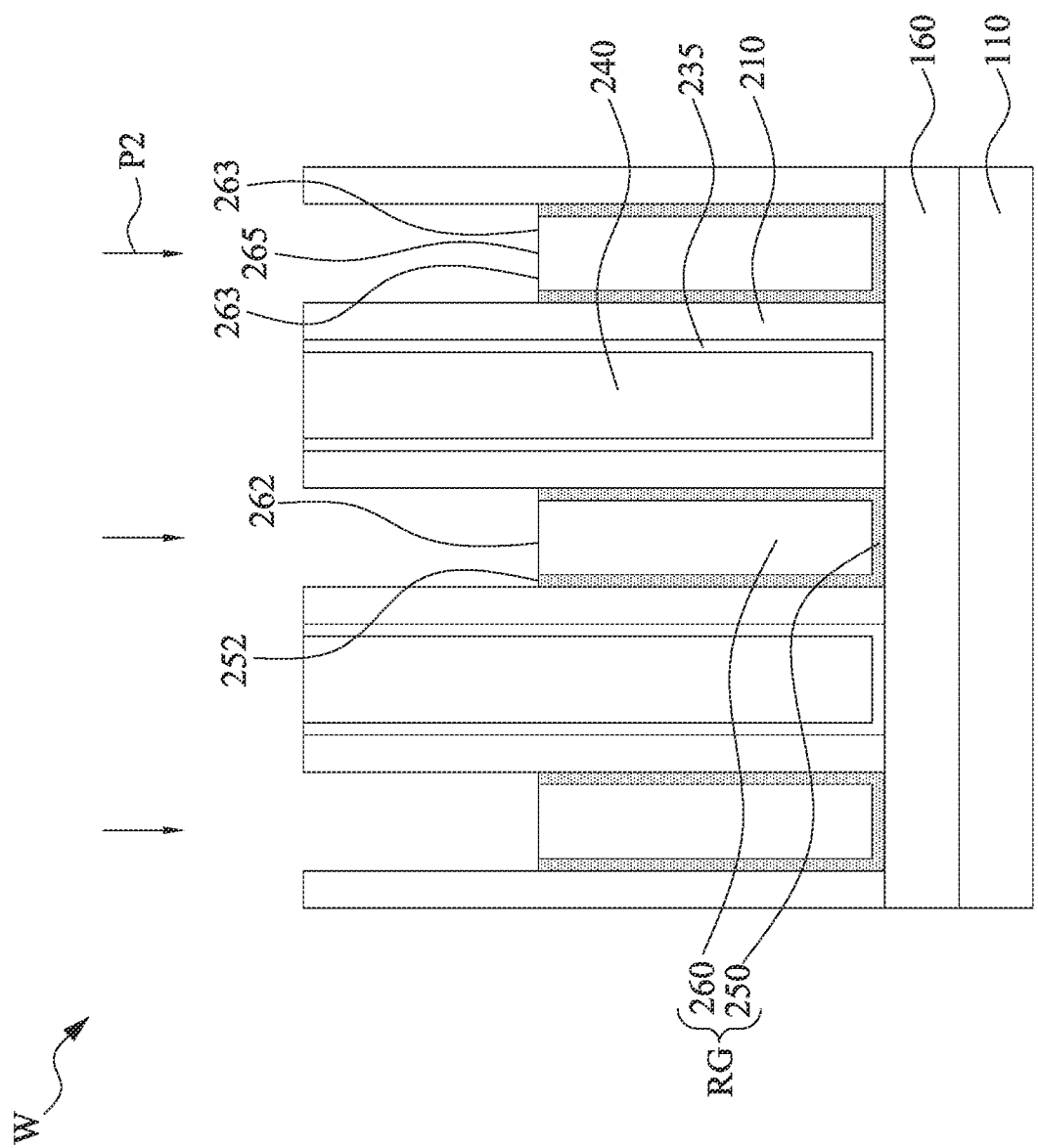

Reference is made to FIGS. 17A and 17B. The zero bias plasma etching step P2 is performed to flatten the top surfaces of the gate structures RG, because zero bias can drive more plasmas to attack regions close to the gate spacers 210 compared to non-zero bias. In this way, residues of the gate structures RG on sidewalls of gate spacers 210 can be removed. In greater detail, the zero bias etching step P2 intrinsically exhibits faster etch rate at the regions (e.g., peripheral regions of the gate structure RG) close to the gate spacers 210 than that at regions (e.g., central region of the gate structure RG) farther away from the gate spacers 210. The etch rate difference results in flattened top surfaces of the resulting gate structure RG having reduced curvature compared to the curved top surfaces resulting from the non-zero bias plasma etching step P1. In some embodiments, the zero bias plasma etching step P2 uses a gas mixture of $BCl_3$, and Ar.

In greater detail, during the zero bias plasma etching step P2, the etching rate of the metal gate electrode 260 adjacent to the gate spacers 210 (e.g., the peripheral regions 263 of the metal gate electrode 260) is greater than that away from the gate spacers 210 (e.g., central regions 265 of the metal gate electrode 260). In addition, the etching rate of the gate dielectric layer 250 is greater than that of the metal gate electrode 260. In other words, in a process period of the second plasma etching step P2, a removed amount of the metal gate electrode 260 adjacent to the gate spacers 210 is greater than a removed amount of the metal gate electrode 260 away from the gate spacers 210. A removed amount of the gate dielectric layer 250 is greater than a removed amount of the metal gate electrode 260 adjacent to the gate spacers 210 for the process period of the zero bias plasma etching step P2. Hence, after the zero bias plasma etching step P2, a top surface 252 of the remained gate dielectric layer 250 is substantially flush with a top surface 262 of the remained metal gate electrode 260.

In other words, a top surface of the metal gate electrode 260 after performing the zero bias etching step P2 has less curvature than a top surface of the metal gate electrode 260 prior to performing the zero bias etching step P2, and a top surface of the metal gate electrode 260 after performing the non-zero bias plasma etching step P1 has greater curvature than a top surface of the metal gate electrode 260 prior to performing the non-zero bias plasma etching step P1.

Figure 18B:
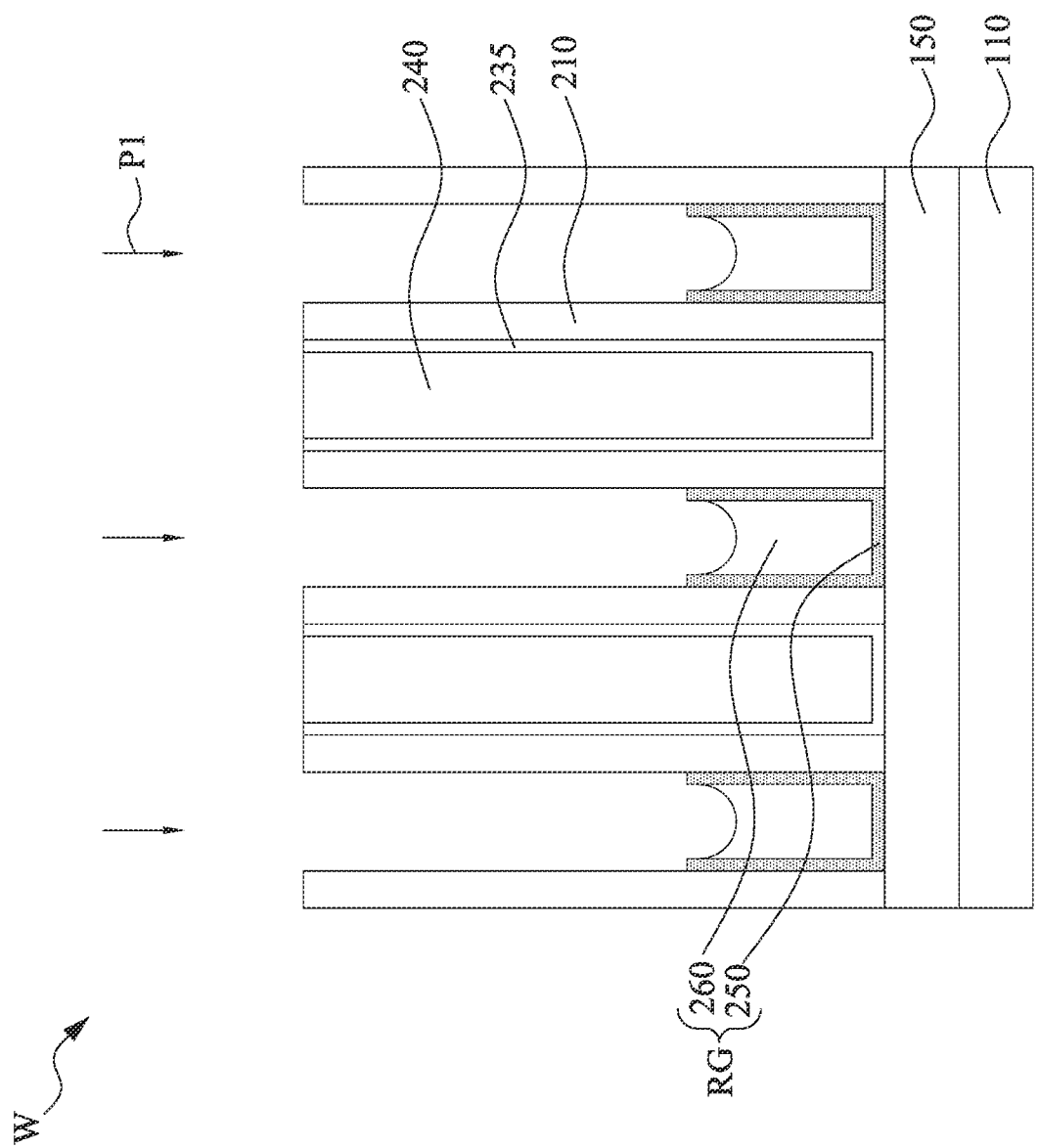
Figure 19A:
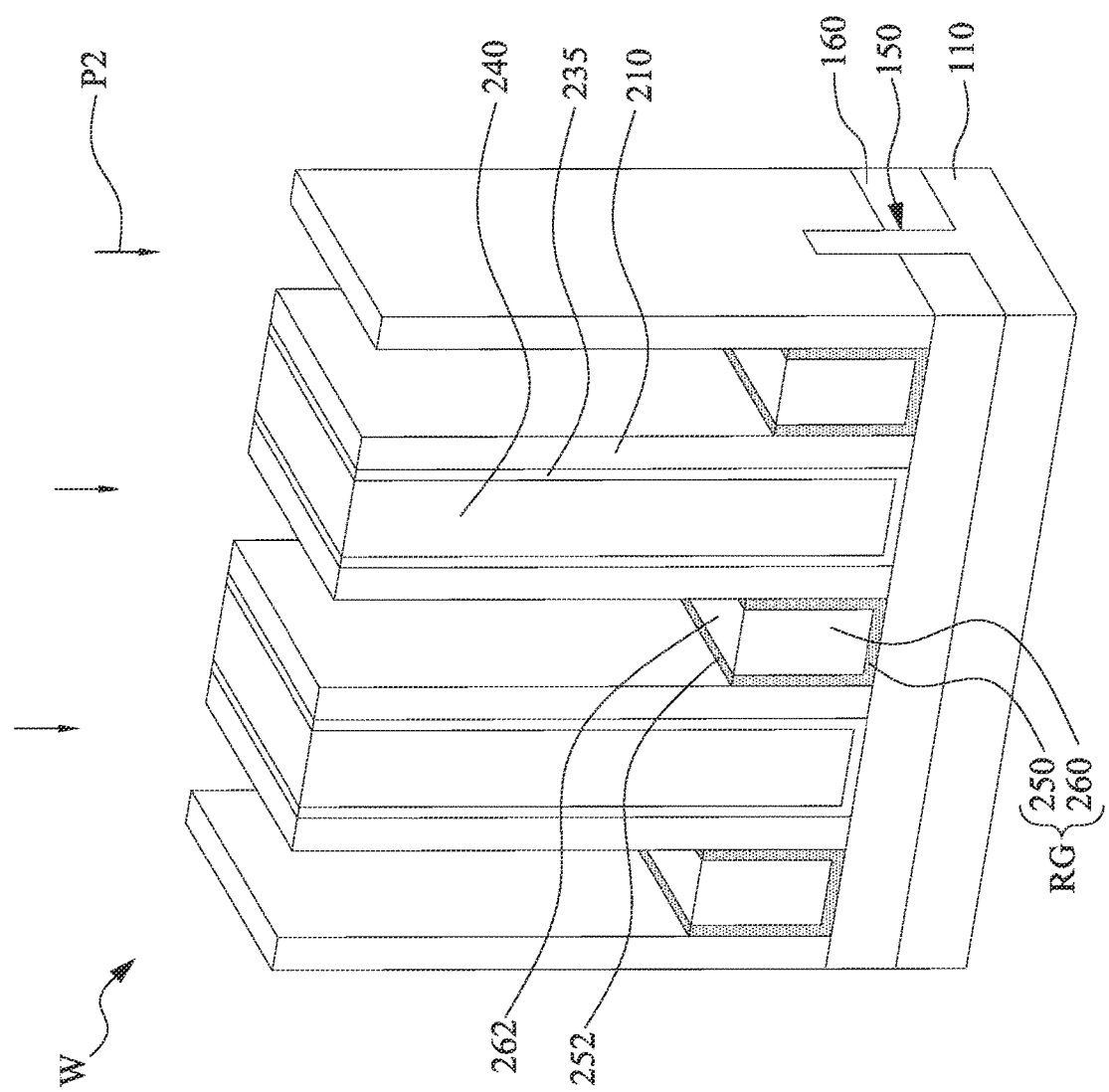
Figure 19B:
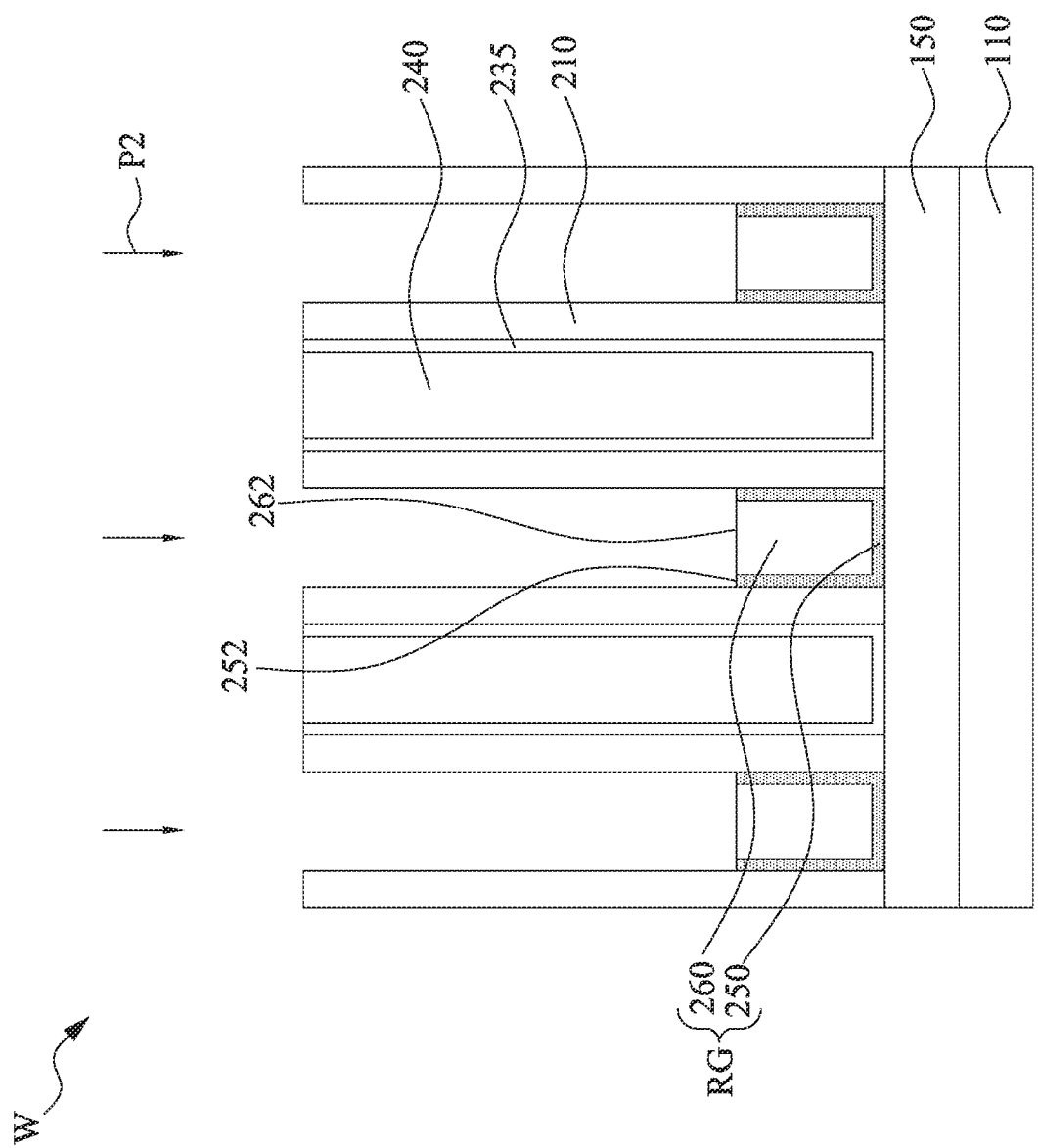

After performing the zero bias plasma etching step P2, another non-zero bias plasma etching step P1 is performed to the gate structures RG, so that the gate structures RG are further thinned down. The resulting structure is shown in FIGS. 18A and 18B. However, the further thinned down gate structures RG have concave top surfaces due to the nature of non-zero bias plasma etching as discussed previously. Therefore, another zero bias plasma etching step P2 is performed to the further thinned down gate structures RG, so as to flatten the top surfaces of the further thinned down gate structures RG. The resulting structure is shown in FIGS. 19A and 19B. FIGS. 16A-19B illustrate one repetition of the non-zero bias plasma etching step P1 and the zero bias plasma etching step P2. However, in some other embodiments, more than one repetition of the non-zero bias plasma etching step P1 and the zero bias plasma etching step P2 can be involved.

Figure 20A:
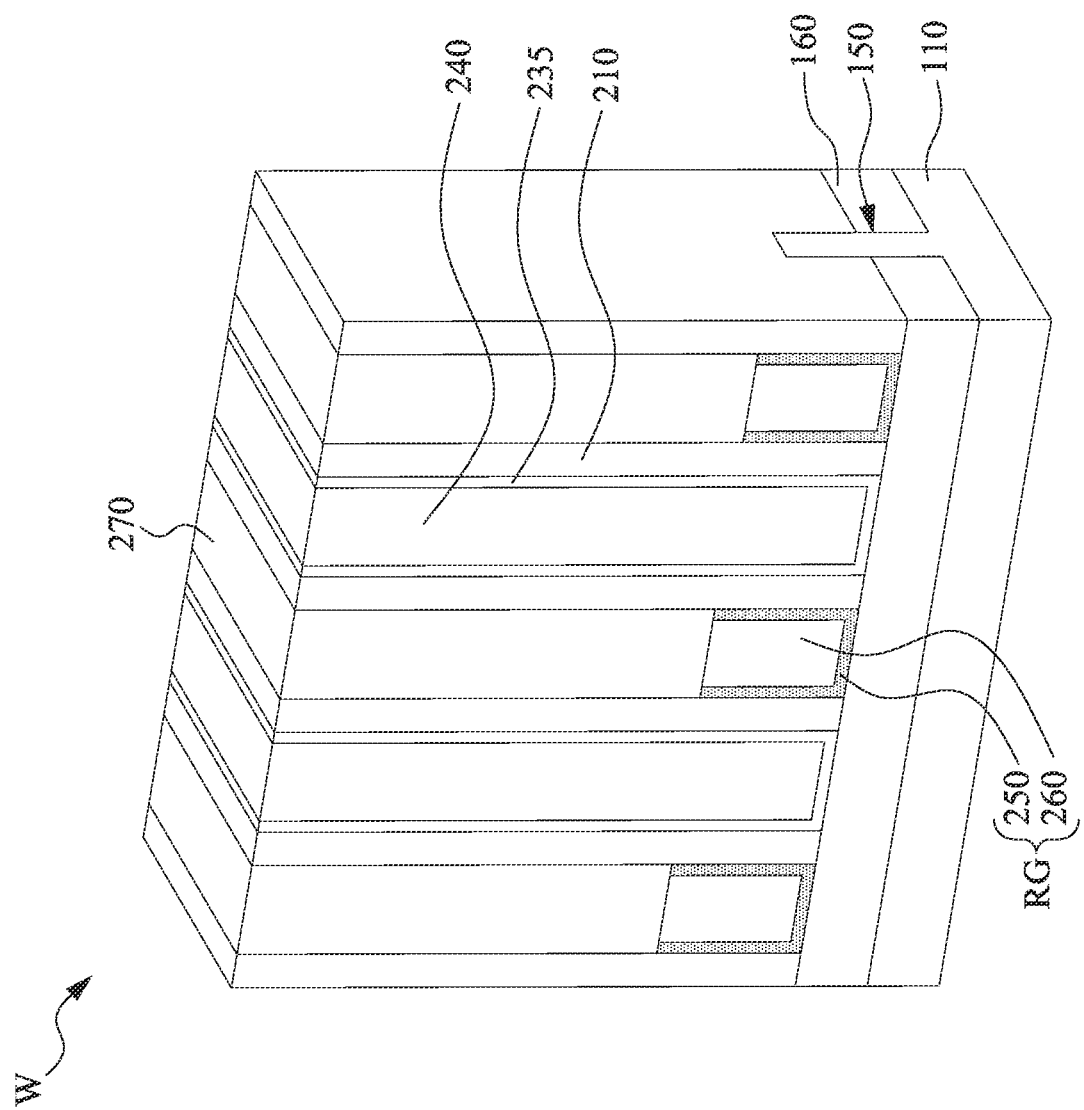

Returning to FIG. 1B, the method M then proceeds to block S25 where dielectric caps are formed over respective gate structures. With reference to FIGS. 20A and 20B, in some embodiments of block S25, dielectric caps 270 are formed over respective gate structures RG using, for example, a deposition process to deposit a dielectric material over the substrate 110, followed by a CMP process to remove excess dielectric material outside the gate trenches. In some embodiments, the dielectric caps 270 include silicon nitride or other suitable dielectric material. The dielectric caps 270 have different etch selectivity than the spacers 210, the contact etch stop layer 235, and/or the inter-layer dielectric layer 240, so as to selective etch back the dielectric caps 270. By way of example, if the dielectric cap 270 is SiN, the spacers 210, the contact etch stop layer 235, and/or the inter-layer dielectric layer 240 are dielectric materials different from SiN. The dielectric caps 270 can be used to define self-aligned contact region and thus referred to as SAC structures or a SAC layer.

Returning to FIG. 1B, block S26 in the method M is directed to an improved etch back process for the SAC layer according to some embodiments of the present disclosure. In the present disclosure, the improved etch back process for the SAC layer is a plasma etching process employing one or more etchants such as a fluorine-containing gas (e.g., $CF_4$/$H_2$, $SF_6$, $CH_2F_2$, $CHF_3$, $C_2F_6$, and/or $NF_3/N_2$) and/or a chlorine-containing gas (e.g., $Cl_2$, $CHCl_3$, $CCl_4$, and/or $BCl_3$). In some embodiments, the improved etch back process for the SAC layer is a plasma etching process employing $C_2H_6$.

By way of example, the plasma etching process used in the improved etch back process for the SAC layer uses a gas mixture including an argon (Ar) gas, a trifluoromethane ($CH_3F$) gas, an Helium (He) gas, and the like. In certain embodiments of the present disclosure, the improved SAC layer etch back process is a multi-step plasma etching process involving a non-zero bias etching step and a zero-bias etching step in-situ performed in the same plasma process apparatus, as illustrated in FIG. 27.

In certain embodiments of block S26, with reference to FIGS. 21A-24B, the improved SAC layer etch back process is a cyclic process including at least one repetition of a non-zero bias etching step and a zero bias etching step. For example, it may perform a non-zero bias etching step (e.g., FIGS. 21A and 21B) followed by a zero bias etching step (e.g., FIGS. 22A and 22B), and repeats the non-zero bias etching step (e.g., FIGS. 23A and 23B) and the zero bias etching step (e.g., FIGS. 24A and 24B).

Figure 21A:
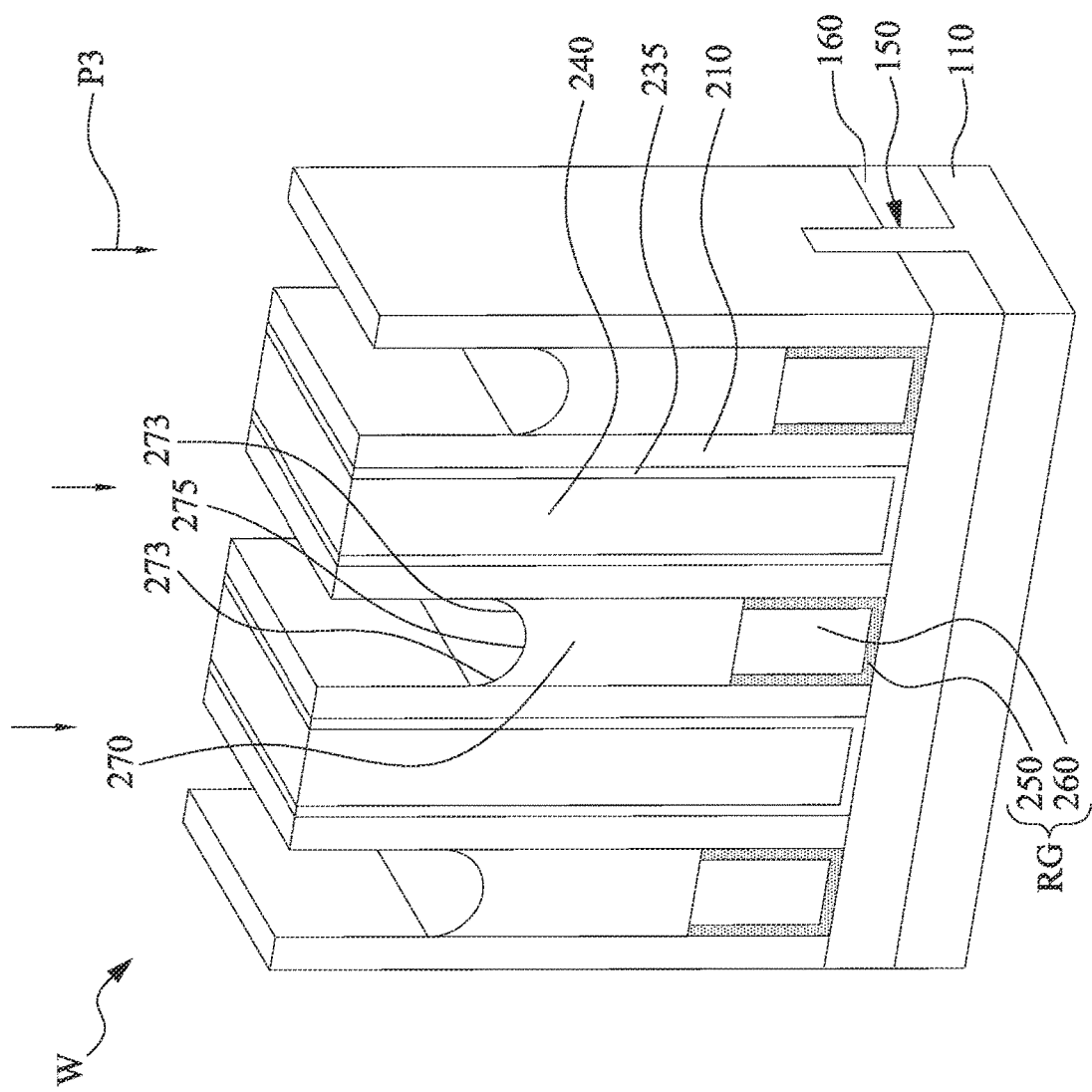

As shown in FIGS. 21A and 21B, the non-zero bias plasma etching step P3 is performed to thin down the dielectric caps 270, because the non-zero bias can drive more plasmas to the scaled down dielectric caps 270 compared to zero bias. In some embodiments, the non-zero bias plasma etching step P3 uses a gas mixture of $CH_3F$, He, and Ar with a bias in a range from about 25V to about 1200V. Due to the nature of plasmas driven by non-zero bias, the non-zero bias etching step P3 exhibits slower etch rate at the regions close to the gate spacers 210 (e.g., peripheral regions of the dielectric cap 270) than that at regions farther away from the gate spacers 210 (e.g., a middle region of the dielectric cap 270). The etch rate difference leads to curved top surfaces of the resulting dielectric cap 270, which may be undesirable for subsequent deposition in the gate trenches.

In greater detail, during the non-zero bias plasma etching step P3, the etching rate of the dielectric cap 270 adjacent to the gate spacer 210 (e.g., peripheral regions 273 of the dielectric cap 270) is less than that away from the gate spacer 210 (e.g., central regions 275 of the dielectric cap 270). In other words, in the non-zero bias plasma etching step P3, a removed amount of the dielectric cap 270 adjacent to the gate spacer 210 is less than a removed amount of the dielectric cap 270 away from the gate spacer 210 for the process period of the non-zero bias plasma etching step P3. Hence, after the non-zero bias plasma etching step P3, the remained dielectric cap 270 is recessed toward the substrate 110 and results in a concave profile.

Figure 22A:
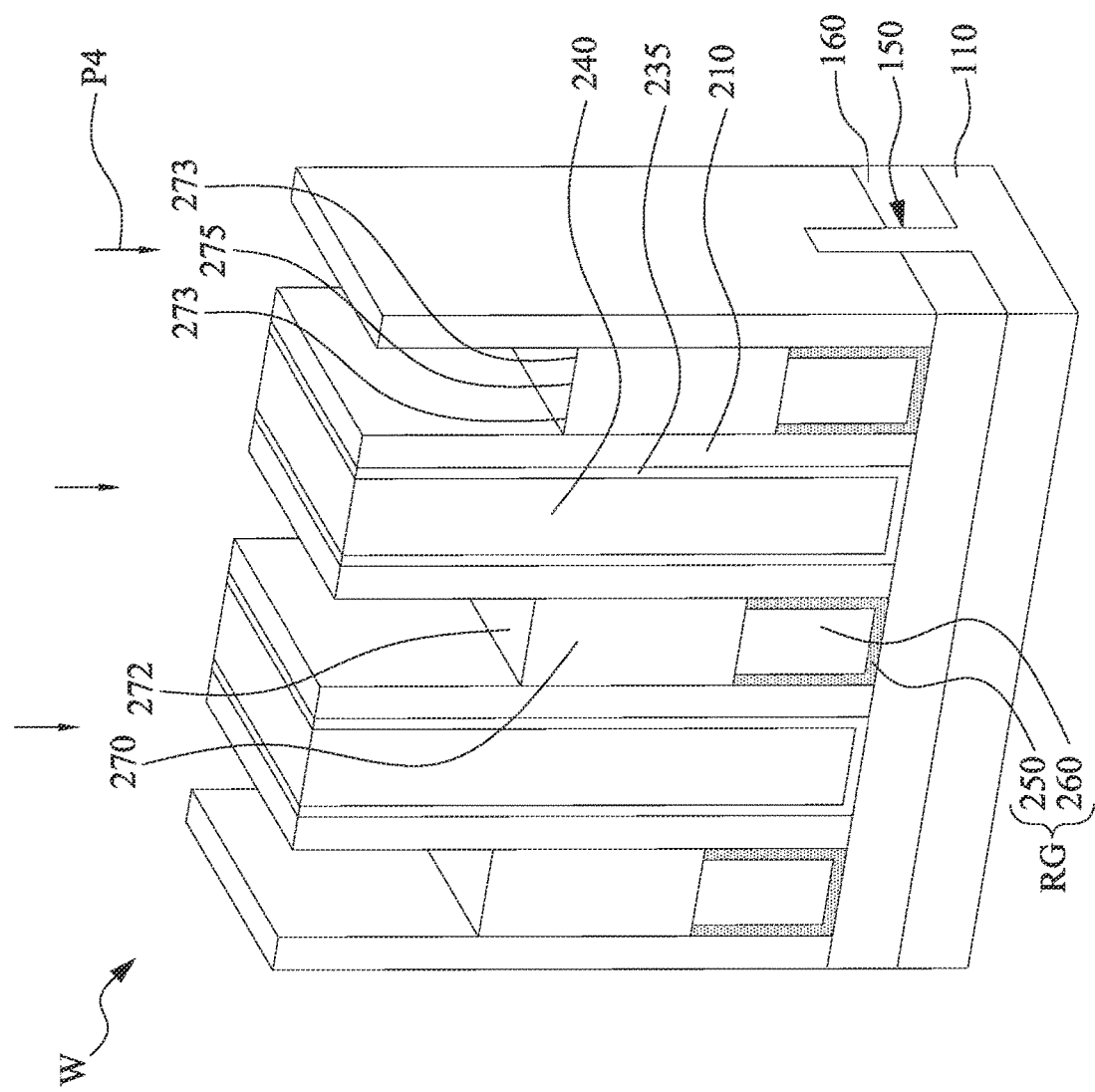
Figure 22B:
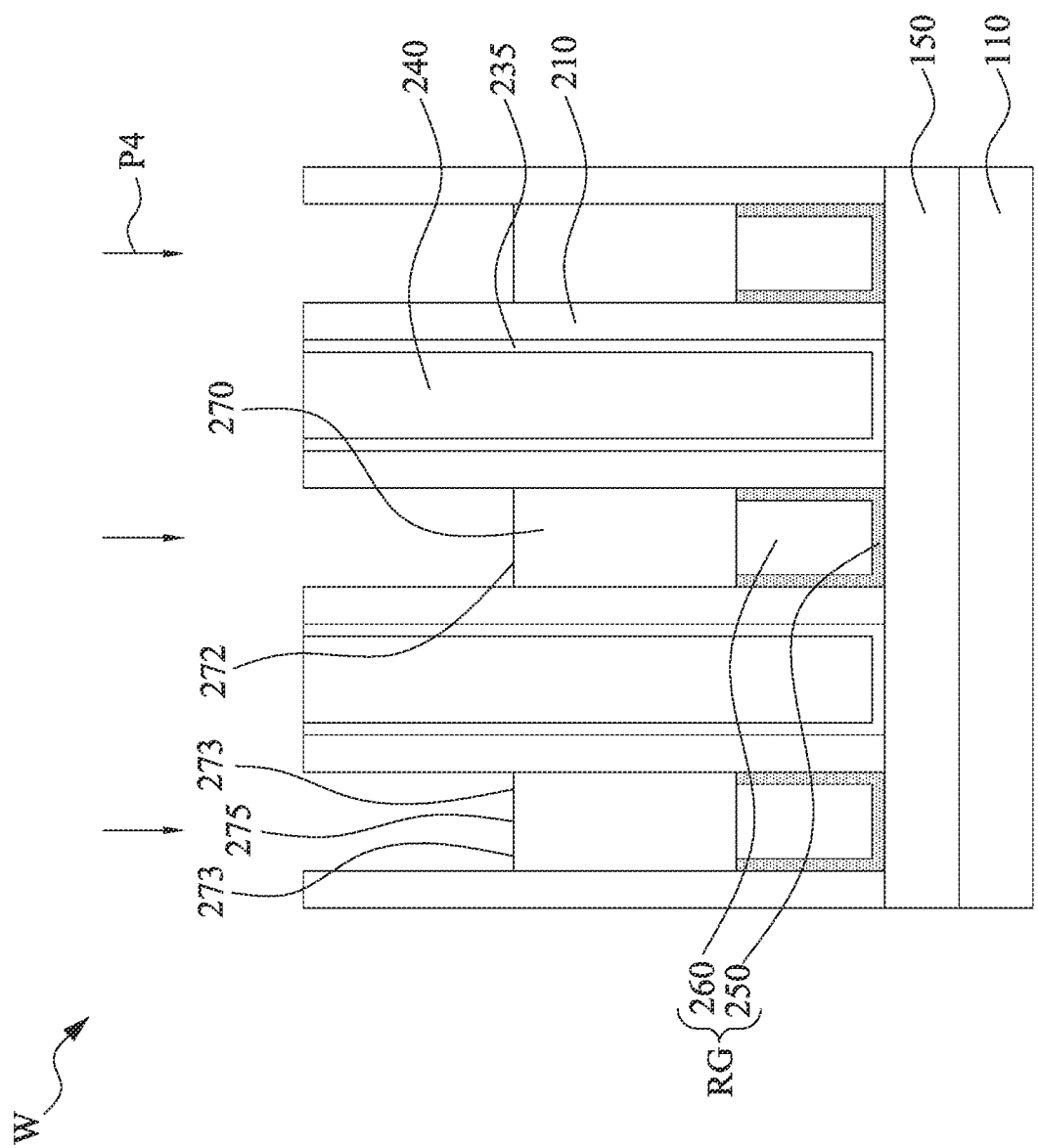

Reference is made to FIGS. 22A and 22B. The zero bias plasma etching step P4 is performed to flatten the top surfaces of the dielectric caps 270, because zero bias can drive more plasmas to attack regions close to the gate spacers 210 compared to non-zero bias. In this way, residues of the dielectric caps 270 on sidewalk of gate spacers 210 can be removed. In greater detail, the zero bias etching step P4 intrinsically exhibits faster etch rate at the regions (e.g., peripheral regions of the dielectric cap 270) close to the gate spacers 210 than that at regions (e.g., central region of the dielectric cap 270) farther away from the gate spacers 210. The etch rate difference results in flattened top surfaces of the resulting dielectric cap 270 having reduced curvature compared to the curved top surfaces resulting from the non-zero bias plasma etching step P3. In some embodiments, the zero bias plasma etching step P4 uses a gas mixture of $CH_3F$, He, and Ar.

In greater detail, during the zero bias plasma etching step P4, the etching rate of the dielectric cap 270 adjacent to the gate spacers 210 (e.g., the peripheral regions 273 of the dielectric cap 270) is greater than that away from the gate spacers 210 (e.g., the central regions 275 of the dielectric cap 270). In other words, in a process period of the second plasma etching step P4, a removed amount of the dielectric cap 270 adjacent to the gate spacers 210 is greater than a removed amount of the dielectric cap 270 away from the gate spacers 210 for the process period of the zero bias plasma etching step P4. Hence, after the zero bias plasma etching step P4, a top surface 272 of the dielectric cap 270 is flat.

In other words, a top surface of the dielectric cap 270 after performing the zero bias plasma etching step P4 has less curvature than a top surface of the dielectric cap 270 prior to performing the zero bias plasma etching step P4, and a top surface of the dielectric cap 270 after performing the non-zero bias plasma etching step P3 has greater curvature than a top surface of the dielectric cap 270 prior to performing the non-zero bias plasma etching step P3.

Figure 23A:
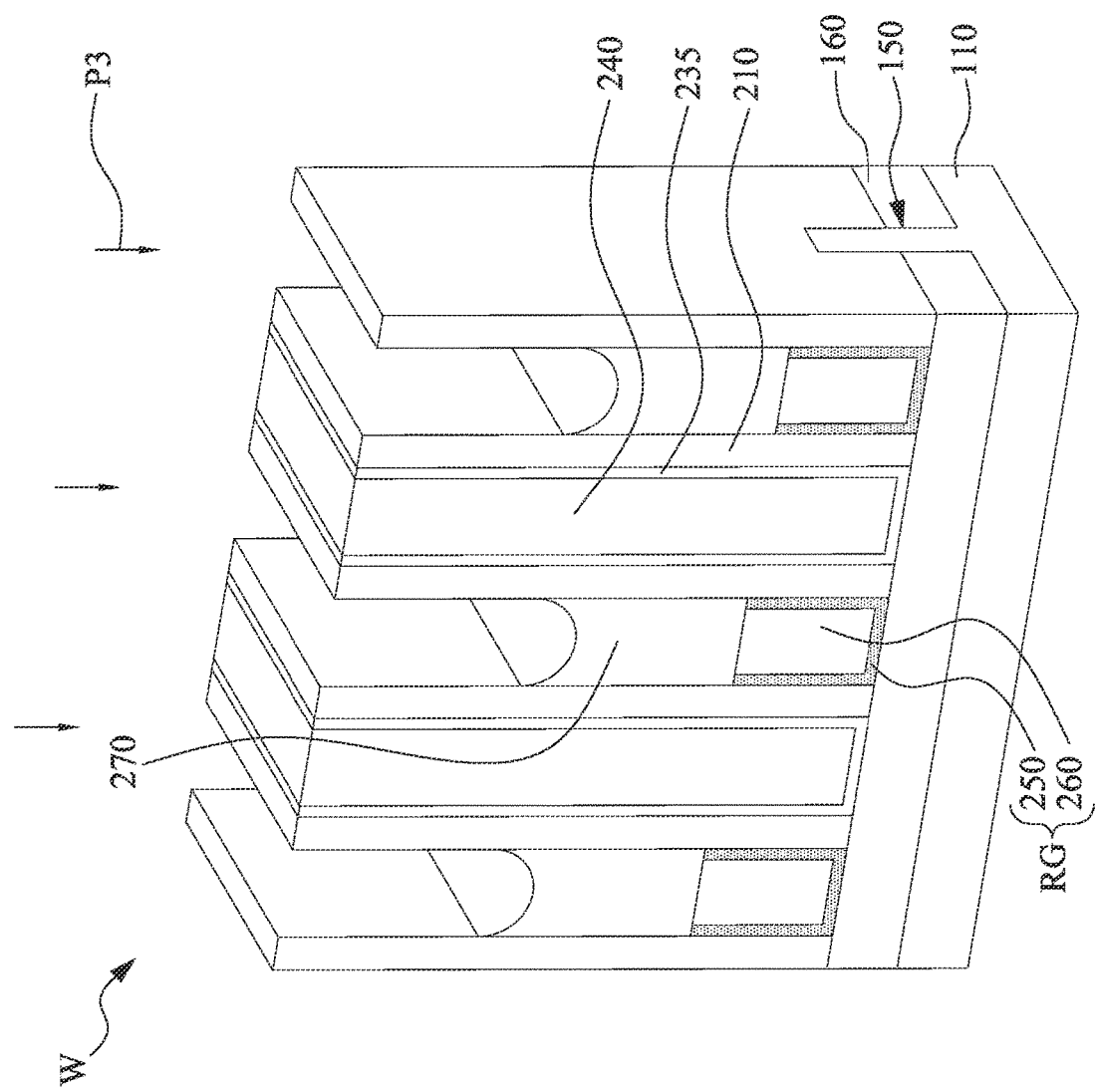
Figure 24A:
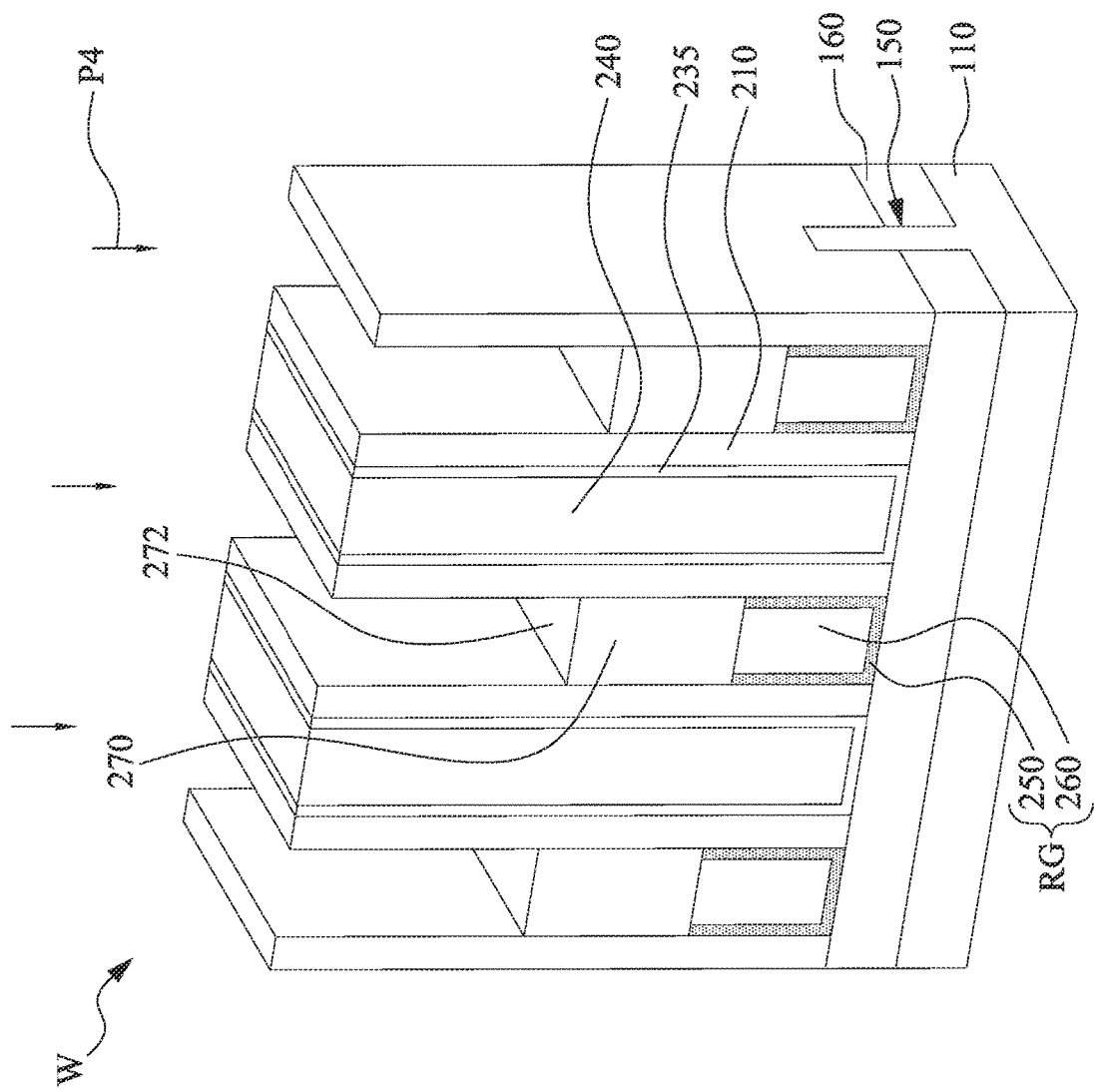
Figure 24B:
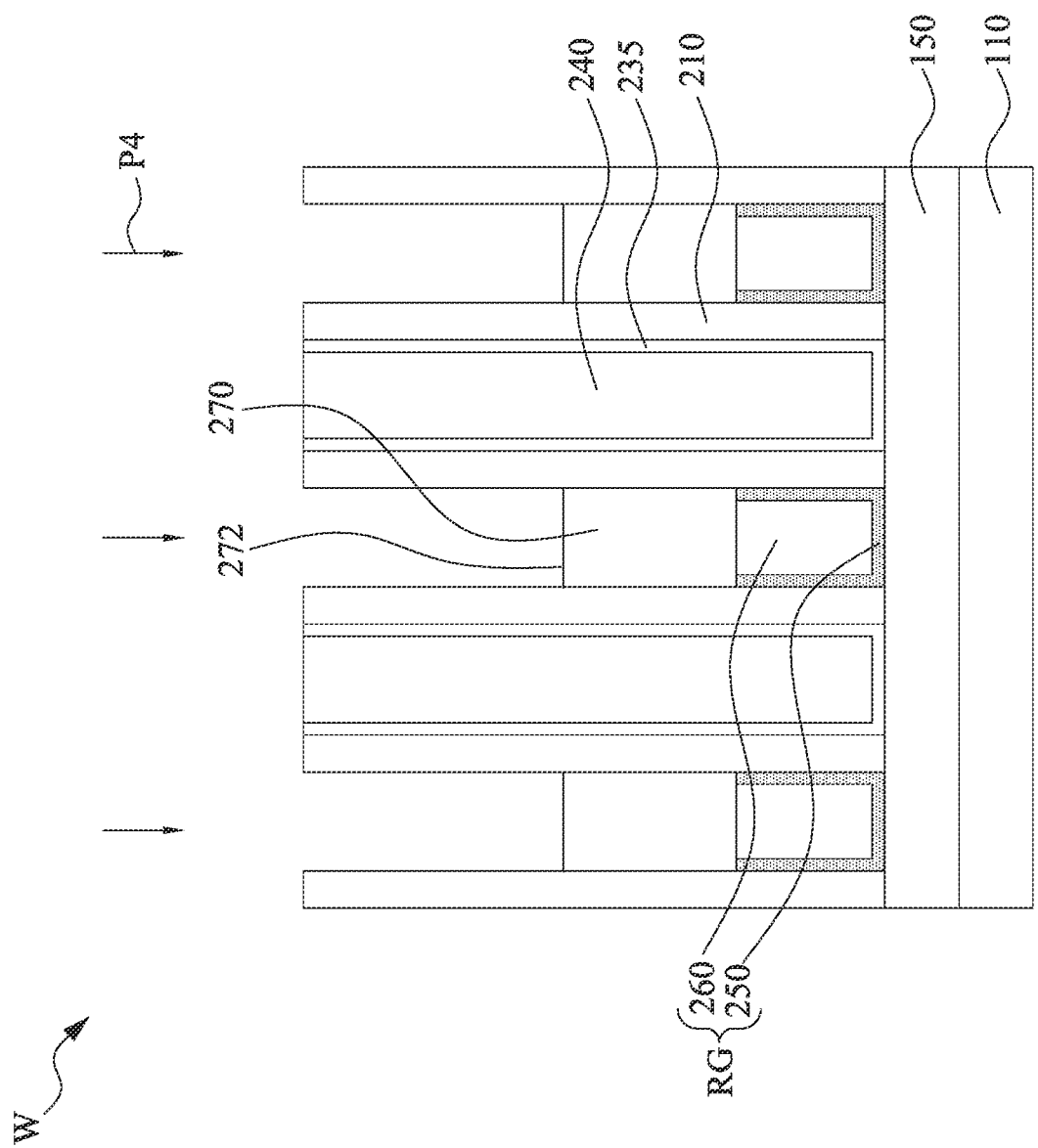

After performing the zero bias plasma etching step P4, another non-zero bias plasma etching step P3 is performed to the dielectric caps 270, so that the dielectric caps 270 are further thinned down. The resulting structure is shown in FIGS. 23A and 23B. However, the further thinned down dielectric caps 270 have concave top surfaces due to the nature of non-zero bias plasma etching as discussed previously. Therefore, another zero bias plasma etching step P4 is performed to the further thinned down dielectric caps 270, so as to flatten the top surfaces of the further thinned down dielectric caps 270. The resulting structure is shown in FIGS. 24A and 24B. FIGS. 21A-24B illustrate one repetition of the non-zero bias plasma etching step P3 and the zero bias plasma etching step P4. However, in some other embodiments, more than one repetition of the non-zero bias plasma etching step P3 and the zero bias plasma etching step P4 can be involved.

Figure 25A:
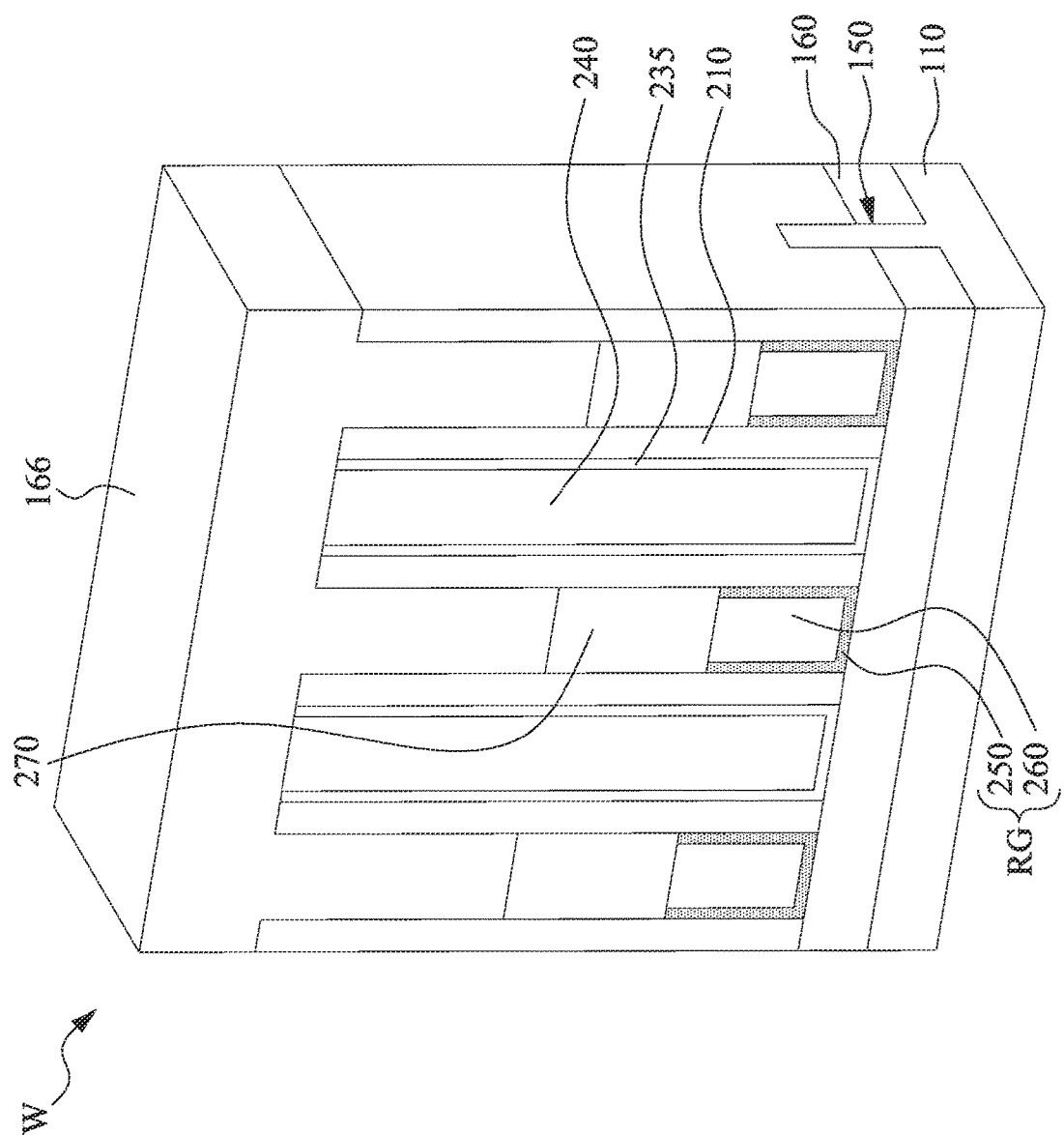
Figure 25B:
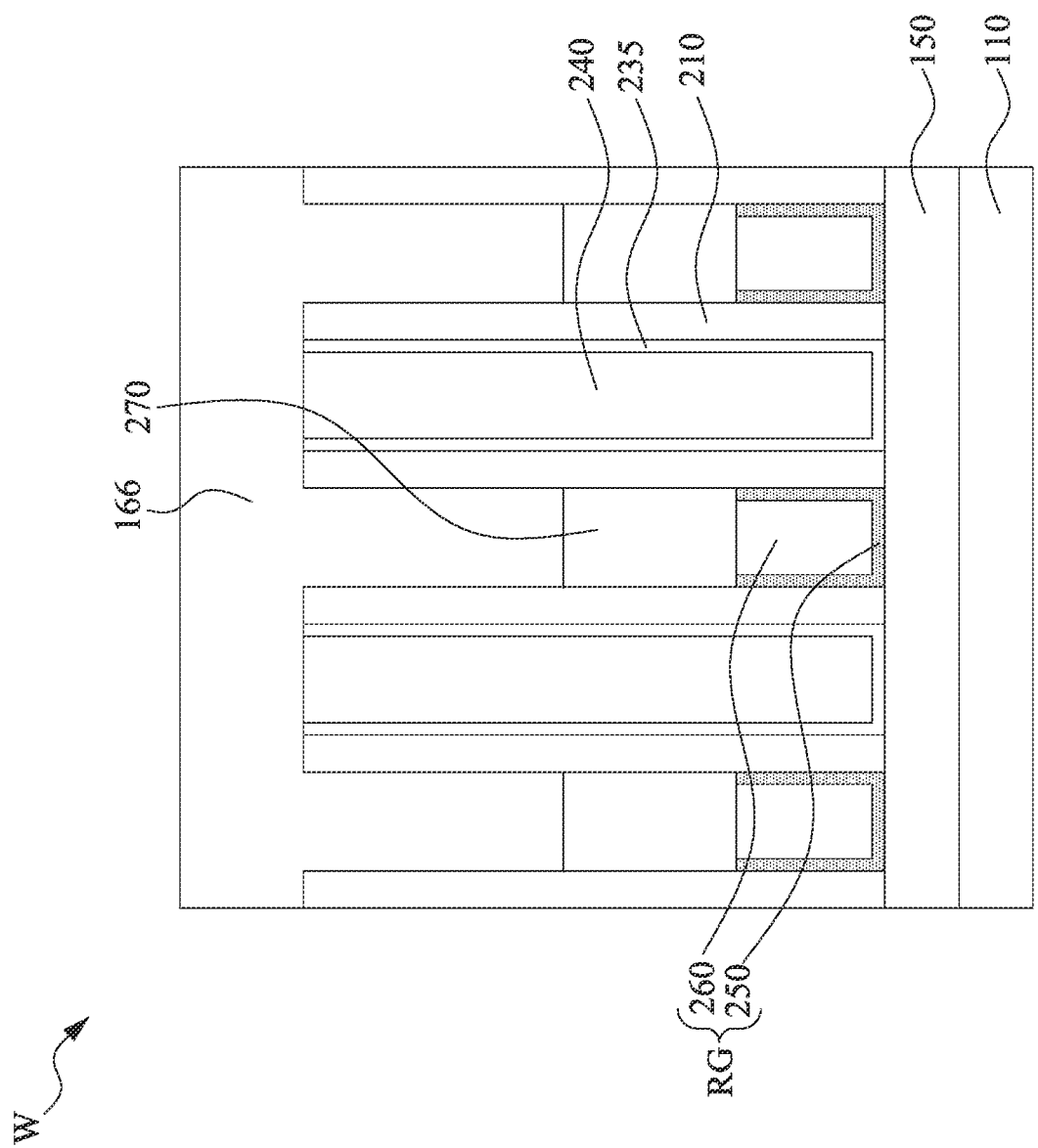

Returning to FIG. 1B, the method M then proceeds to block S27 where a hard mask material is formed over the dielectric caps. With reference to FIGS. 25A and 25B, in some embodiments of block S27, A hard mask material 166 is formed over the substrate 110 and covers the spacers 210, the CESL 235, the ILD layer 240, the gate structures RG, and the dielectric caps 270. Furthermore, the dielectric cap 270 is in contact with the metal gate electrode 260 and the hard mask material 166 and between the spacers 210.

In some embodiments, the hard mask material 166 includes dielectric material such as, Si, SiO, SiN, AlO, or combinations thereof. The hard mask material 166 may include a material which is different from the spacers 210, the CESL 235, the ILD layer 240, and/or the dielectric caps 270 to achieve etching selectivity during etching processes performed later.

Figure 26A:
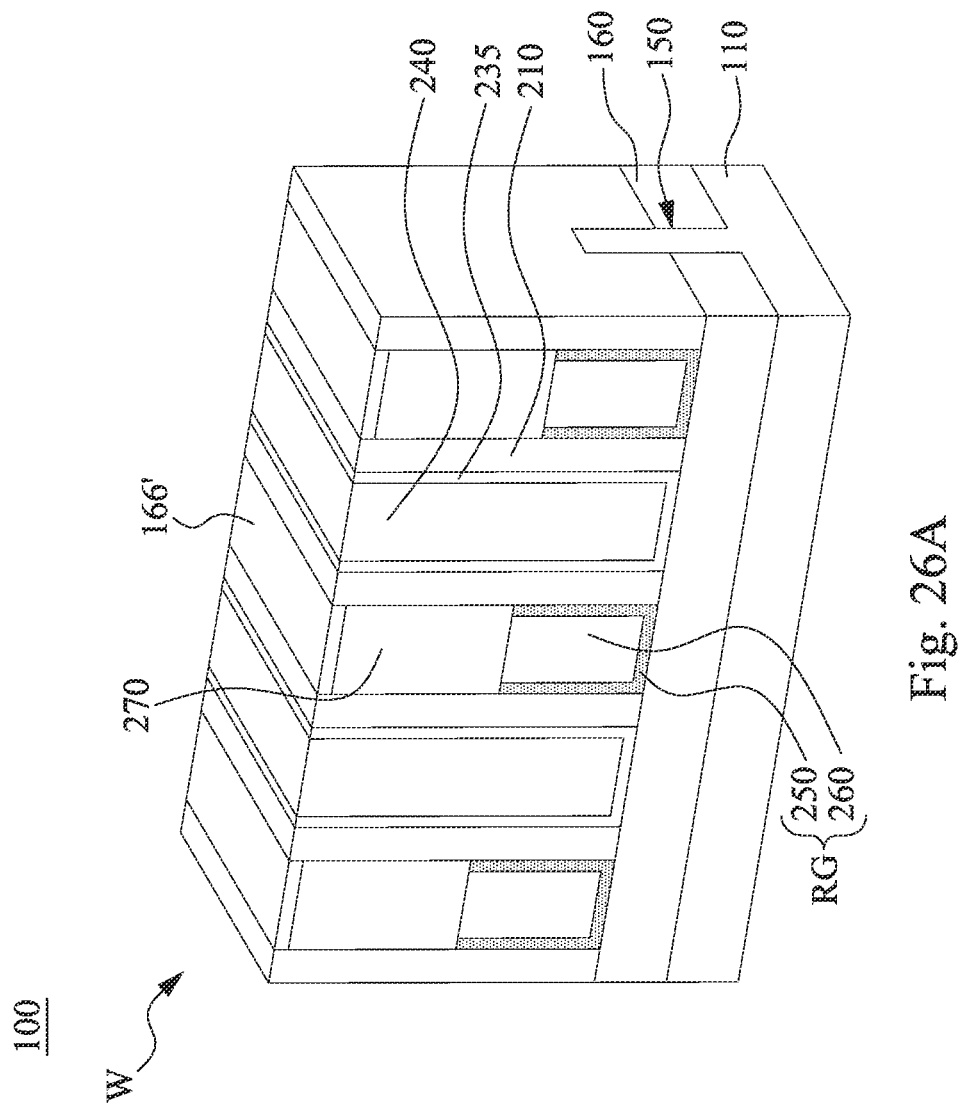
Figure 26B:
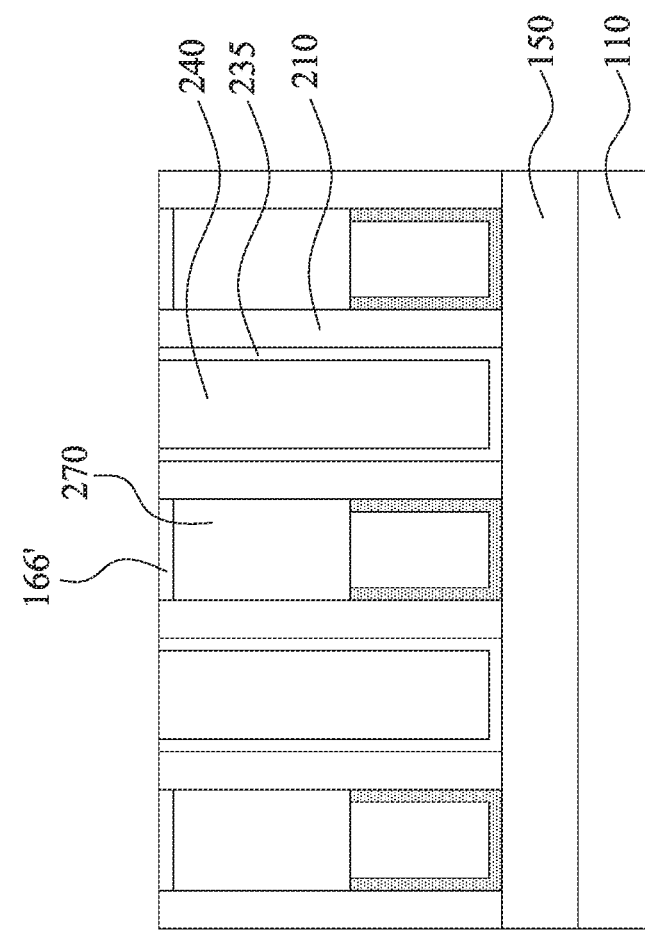

Returning to FIG. 1B, the method M then proceeds to block S28 where a planarization process is performed to the hard mask material. With reference to FIGS. 26A and 26B, in some embodiments of block S28, after the hard mask material 166 is formed, one or more CMP processes are performed to polish back the hard mask material 166 until the spacers 210, the CESL 235, and the ILD layer 240 are exposed. Because the dielectric cap 270 has a flattened top surface, rather than a concave top surface, a bottommost position of the resulting hard mask layer 166' is not lower than a topmost position of the dielectric cap 270.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that non-zero bias etch back process can be employed to thin down materials. Another advantage is that the concave top surfaces of remaining materials resulting from the non-zero bias process can be flattened by using zero bias etching process. By performing non-zero bias etching process and zero bias etching process, the materials can be thinned down to a desired height and have a flattened top surface.

In some embodiments, a method for manufacturing a semiconductor device, includes: forming a dummy gate structure on a semiconductor substrate; forming a plurality of gate spacers on opposite sidewalls of the dummy gate structure; removing the dummy gate structure from the semiconductor substrate; forming a metal gate electrode on the semiconductor substrate and between the gate spacers; and performing a plasma etching process to the metal gate electrode, in which the plasma etching process includes performing in sequence a first non-zero bias etching step and a first zero bias etching step.

In some embodiments, during the first zero bias etching step, an etch rate at a peripheral region of the metal gate electrode is faster than an etch rate at a central region of the metal gate electrode.

In some embodiments, during the first non-zero bias etching step, an etch rate at a peripheral region of the metal gate electrode is slower than an etch rate at a central region of the metal gate electrode.

In some embodiments, the first zero bias etching step is performed such that a top surface of the metal gate electrode is flattened.

In some embodiments, a top surface of the metal gate electrode after performing the first zero bias etching step has less curvature than a top surface of the metal gate electrode prior to performing the first zero bias etching step.

In some embodiments, a top surface of the metal gate electrode after performing the first non-zero bias etching step has greater curvature than a top surface of the metal gate electrode prior to performing the first non-zero bias etching step.

In some embodiments, the first non-zero bias etching step and the first zero bias etching step are performed in the same chamber.

In some embodiments, the method further includes: forming a gate dielectric layer between the gate spacers prior to forming the metal gate electrode, in which the plasma etching process is further performed to the gate dielectric layer.

In some embodiments, a top surface of the gate dielectric layer is at a higher position than a top surface of the metal gate electrode after performing the first non-zero bias etching step.

In some embodiments, the top surface of the gate dielectric layer is substantially level with the top surface of the metal gate electrode after performing the first zero bias etching step.

In some embodiments, the plasma etching process further includes performing a second non-zero bias etching step after performing the first zero bias etching step, and performing a second zero bias etching step after performing the second non-zero etching step.

In some embodiments, a method for manufacturing a semiconductor device, includes: forming a dummy gate structure on a semiconductor substrate; forming a plurality of gate spacers on opposite sidewalls of the dummy gate structure; replacing the dummy gate structure with a replacement gate structure; etching the replacement gate structure; forming a dielectric cap over the etched replacement gate structure and between the gate spacers; and performing a plasma etching process to the dielectric cap, in which the plasma etching process includes performing in sequence a first non-zero bias etching step and a first zero bias etching step.

In some embodiments, during the first zero bias etching step, an etch rate at a peripheral region of the dielectric cap is faster than an etch rate at a central region of the dielectric cap.

In some embodiments, during the first non-zero bias etching step, an etch rate at a peripheral region of the dielectric cap is slower than an etch rate at a central region of the dielectric cap.

In some embodiments, the first zero bias etching step is performed such that a top surface of the dielectric cap is flattened.

In some embodiments, a top surface of the dielectric cap after performing the first zero bias etching step has less curvature than a top surface of the dielectric cap prior to performing the first zero bias etching step.

In some embodiments, a top surface of the dielectric cap after performing the first non-zero bias etching step has greater curvature than a top surface of the dielectric cap prior to performing the first non-zero bias etching step.

In some embodiments, the plasma etching process further includes performing a second non-zero bias etching step after performing the first zero bias etching step, and performing a second zero bias etching step after performing the second non-zero etching step.

In some embodiments, the method further includes: forming a hard mask over the dielectric cap and between the gate spacers; and performing a chemical mechanical polish process to the hard mask until the gate spacers are exposed.

In some embodiments, a semiconductor device includes a substrate, a plurality of gate spacers, a gate structure, a dielectric cap, and a hard mask. The gate spacers are disposed over the substrate. The gate structure is disposed between the gate spacers. The dielectric cap is disposed atop the gate structure and between the gate spacers. The hard mask is disposed atop the dielectric cap and between the gate spacers. A bottommost position of the hard mask is not lower than a topmost position of the dielectric cap.

In some embodiments, a semiconductor device includes a substrate, a semiconductor fin, a gate electrode, a pair of gate spacers, a dielectric cap, and a hard mask layer. The semiconductor fin extends upwardly from the substrate. The gate electrode straddles the semiconductor fin. The pair of gate spacers is on opposite sidewalls of the gate electrode. The dielectric cap is atop the gate electrode and laterally between the pair of gate spacers. The hard mask layer is atop the dielectric cap and laterally between the pair of gate spacers. A bottommost position of the hard mask layer is not lower than a topmost position of the dielectric cap.

In some embodiments, a bottommost position of the dielectric cap is not lower than a topmost position of the gate electrode.

In some embodiments, the semiconductor device further includes a gate dielectric layer lining the gate electrode and having an U-shaped when viewed in a cross section, wherein a topmost end surface of the gate dielectric layer is level with a top surface of the gate electrode.

In some embodiments, the semiconductor device further includes a gate dielectric layer lining the gate electrode and having an U-shaped when viewed in a cross section, wherein a bottommost position of the dielectric cap is not lower than a topmost position of the gate dielectric layer.

In some embodiments, a top surface of the dielectric cap is parallel to a top surface of the gate electrode.

In some embodiments, a top surface of the hard mask layer is level with top surfaces of the pair of gate spacers.

In some embodiments, the hard mask layer is thinner than the dielectric cap.

In some embodiments, the hard mask layer includes metal oxide.

In some embodiments, the hard mask layer includes an aluminum-containing material.

In some embodiments, the dielectric cap includes silicon nitride.

In some embodiments, a semiconductor device includes a substrate, a semiconductor fin, a gate structure, a source/drain structure, and a dielectric cap. The semiconductor fin extending above the substrate. The gate structure is across the semiconductor fin. The source/drain epitaxy structure is on the semiconductor fin and adjacent to the gate structure. The dielectric cap is on the gate structure. The dielectric cap has a greater height than the gate structure and has the same width as the gate structure.

In some embodiments, a topmost position of the dielectric cap is higher than a topmost position of the source/drain epitaxy structure.

In some embodiments, the dielectric cap includes silicon nitride.

In some embodiments, the semiconductor device further includes a gate spacer on a sidewall of the gate structure, wherein a top surface of the dielectric cap is lower than a top surface of the gate spacer.

In some embodiments, the semiconductor device further includes a metal oxide layer over the dielectric cap, wherein the metal oxide layer is thinner than the dielectric cap.

In some embodiments, the semiconductor device further includes a metal oxide layer over the dielectric cap, wherein the metal oxide layer has the same width as the gate structure.

In some embodiments, a semiconductor device includes a substrate, a semiconductor fin, a pair of gate spacers, a gate electrode, a gate dielectric layer, a silicon nitride layer, and a metal oxide layer. The semiconductor fin is on the substrate. The pair of gate spacers is above the semiconductor tin. The gate electrode is laterally between the pair of gate spacers. The gate dielectric layer lines the gate electrode and has an U-shaped when viewed in a cross section. The silicon nitride layer is over the gate electrode and the gate dielectric layer. The metal oxide layer is over the silicon nitride layer and has a top surface level with top surfaces of the gate spacers.

In some embodiments, an interface between the silicon nitride layer and the gate dielectric layer is at the same level with an interface between the silicon nitride layer and the gate electrode.

In some embodiments, the gate dielectric layer includes a hafnium-containing material.

In some embodiments, the gate dielectric layer includes a zirconium-containing material.

In some embodiments, a method includes forming a semiconductor fin on a substrate; forming a dielectric layer over the semiconductor fin; forming a metal gate electrode in the dielectric layer and extending across the semiconductor fin; forming a source/drain regions on the semiconductor fin and on opposite sides of the metal gate electrode; performing a first non-zero bias plasma etching process to the metal gate electrode; after performing the first non-zero bias plasma etching process, performing a first zero bias plasma etching process to the metal gate electrode. In some embodiments, the method further includes after performing the first zero bias plasma etching process to the metal gate electrode, performing a second non-zero bias plasma etching process to the metal gate electrode. In some embodiments, the method further includes after performing the second non-zero bias plasma etching process, performing a second zero bias plasma etching process to the metal gate electrode. In some embodiments, the method further includes before performing the first non-zero bias plasma etching process, performing a second zero bias plasma etching process to the metal gate electrode. In some embodiments, the first non-zero bias plasma etching process is performed with a bias in a range from about 25V to about 1200V. In some embodiments, the first non-zero bias plasma process is performed by using a gas mixture comprising $Cl_2$, $O_2$, $BCl_3$, and Ar. In some embodiments, the first non-zero bias plasma process is performed by using a gas mixture comprising $SCl_4$. In some embodiments, the zero bias plasma etching step process is performed by using a gas mixture comprising $BCl_3$ and Ar without $Cl_2$ and $O_2$. In some embodiments, the first non-zero bias etching process has a less etch rate on a peripheral region of the metal gate electrode than on a central region of the metal gate electrode. In some embodiments, the first zero bias etching process has a greater etch rate on a peripheral region of the metal gate electrode than on a central region of the metal gate electrode.

In some embodiments, a method includes forming a nanostructured pedestal on a substrate, the nanostructured pedestal having a top surface and opposite side surfaces; forming a dielectric layer wrapping around the top surface and the opposite side surfaces of the nanostructured pedestal; forming a metal layer over the dielectric layer; forming a dielectric cap over the metal layer; forming doped epitaxial structures on the nanostructured pedestal and sandwiching the dielectric layer, the metal layer, and the dielectric cap; performing a first zero bias plasma etching process to the dielectric cap; after performing the first zero bias plasma etching process, performing a first non-zero bias plasma etching process to the dielectric cap. In some embodiments, the method further includes after performing the non-zero bias plasma etching process to the dielectric cap, performing a second zero bias plasma etching process to the dielectric cap. In some embodiments, the method further includes after performing a second zero bias plasma etching process to the dielectric cap, performing a second non-zero bias plasma etching process to the dielectric cap. In some embodiments, the method further includes before performing the first zero bias plasma etching process to the dielectric cap, performing a second non-zero bias plasma etching process to the dielectric cap. In some embodiments, the dielectric cap is made of silicon nitride.

In some embodiments, a semiconductor device includes a semiconductive channel pattern, gate spacers, a gate pattern, a nitride layer, and source and drain patterns. The gate spacers are on the semiconductive channel pattern. The gate pattern is between the gate spacers and extending is across the semiconductive channel pattern from a top view. The gate pattern includes a metal structure and a high-k dielectric layer cupping an underside of the metal structure from a cross-sectional view. The nitride layer is atop the metal structure and the high-k dielectric layer and is laterally between the gate spacers from the cross-sectional view. An interface between the nitride layer and the high-k dielectric layer is at the same level with an interface between the nitride layer and the metal structure. Source and drain patterns on opposite sides of the gate pattern from the top view. In some embodiments, the nitride layer has a top surface in parallel to a top surface of the metal structure. In some embodiments, the semiconductor device further includes a metal oxide layer atop the nitride layer and laterally between the gate spacers. In some embodiments, the metal oxide layer has a top surface level with top surfaces of the gate spacers. In some embodiments, the metal oxide layer has a same width as the nitride layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a semiconductor fin on a substrate;
   forming a dielectric layer over the semiconductor fin;
   forming a metal gate electrode in the dielectric layer and extending across the semiconductor fin;
   forming a source/drain regions on the semiconductor fin and on opposite sides of the metal gate electrode;
   performing a first non-zero bias plasma etching process to the metal gate electrode; and
   after performing the first non-zero bias plasma etching process, performing a first zero bias plasma etching process to the metal gate electrode.

2. The method of claim 1, further comprising:
   after performing the first zero bias plasma etching process to the metal gate electrode, performing a second non-zero bias plasma etching process to the metal gate electrode.

3. The method of claim 2, further comprising:
   after performing the second non-zero bias plasma etching process, performing a second zero bias plasma etching process to the metal gate electrode.

4. The method of claim 1, further comprising:
   before performing the first non-zero bias plasma etching process, performing a second zero bias plasma etching process to the metal gate electrode.

5. The method of claim 1, wherein the first non-zero bias plasma etching process is performed with a bias in a range from about 25V to about 1200V.

6. The method of claim 1, wherein the first non-zero bias plasma etching process is performed by using a gas mixture comprising $Cl_2$, $O_2$, $BCl_3$, and Ar.

7. The method of claim 1, the first non-zero bias plasma etching process is performed by using a gas mixture comprising $SCl_4$.

8. The method of claim 1, wherein the first zero bias plasma etching step process is performed by using a gas mixture comprising $BCl_3$ and Ar without $Cl_2$ and $O_2$.

9. The method of claim 1, wherein the first non-zero bias plasma etching process has a less etch rate on a peripheral region of the metal gate electrode than on a central region of the metal gate electrode.

10. The method of claim 1, wherein the first zero bias plasma etching process has a greater etch rate on a peripheral region of the metal gate electrode than on a central region of the metal gate electrode.

11. A method, comprising:
    forming a nanostructured pedestal on a substrate, the nanostructured pedestal having a top surface and opposite side surfaces;
    forming a dielectric layer wrapping around the top surface and the opposite side surfaces of the nanostructured pedestal;
    forming a metal layer over the dielectric layer;
    forming a dielectric cap over the metal layer;
    forming doped epitaxial structures on the nanostructured pedestal and sandwiching the dielectric layer, the metal layer, and the dielectric cap;
    performing a first zero bias plasma etching process to the dielectric cap; and
    after performing the first zero bias plasma etching process, performing a first non-zero bias plasma etching process to the dielectric cap.

12. The method of claim 11, further comprising:
    after performing the first non-zero bias plasma etching process to the dielectric cap, performing a second zero bias plasma etching process to the dielectric cap.

13. The method of claim 12, further comprising:
    after performing the second zero bias plasma etching process to the dielectric cap, performing a second non-zero bias plasma etching process to the dielectric cap.

14. The method of claim 13, wherein the second non-zero bias plasma etching process is performed with a bias in a range from about 25V to about 1200V.

15. The method of claim 11, further comprising:
    before performing the first zero bias plasma etching process to the dielectric cap, performing a second non-zero bias plasma etching process to the dielectric cap.

16. The method of claim 11, wherein the dielectric cap is made of silicon nitride.

17. The method of claim 11, wherein the first non-zero bias plasma etching process is performed with a bias in a range from about 25V to about 1200V.

18. The method of claim 11, wherein the first non-zero bias plasma etching process is performed by using a gas mixture comprising $Cl_2$, $O_2$, $BCl_3$, and Ar.

19. The method of claim 11, wherein first non-zero bias plasma etching process is performed by using a gas mixture comprising $SCl_4$.

20. The method of claim 11, wherein the first zero bias plasma etching step process is performed by using a gas mixture comprising $BCl_3$ and Ar without $Cl_2$ and $O_2$.

* * * * *